(12) United States Patent
Redfern et al.

(10) Patent No.: US 8,323,798 B2
(45) Date of Patent: Dec. 4, 2012

(54) SYSTEMS AND METHODS FOR DRILLING HOLES IN PRINTED CIRCUIT BOARDS

(75) Inventors: Sean Matthew Redfern, Newport Beach, CA (US); James Joseph Miller, Brea, CA (US); Paul Ronald St. John, Corona, CA (US)

(73) Assignee: Tri-Star Laminates, Inc., Lake Forest, CA (US)

(*) Notice: Subject to any disclaimer, the term of this patent is extended or adjusted under 35 U.S.C. 154(b) by 410 days.

(21) Appl. No.: 12/239,683

(22) Filed: Sep. 26, 2008

(65) Prior Publication Data

US 2009/0214308 A1    Aug. 27, 2009

Related U.S. Application Data

(60) Provisional application No. 60/976,264, filed on Sep. 28, 2007.

(51) Int. Cl.
| | |
|---|---|
| *B32B 27/38* | (2006.01) |
| *B32B 15/08* | (2006.01) |
| *B32B 37/38* | (2006.01) |
| *G11B 11/105* | (2006.01) |
| *C09J 7/02* | (2006.01) |

(52) U.S. Cl. ......... 428/413; 428/418; 428/332; 428/337

(58) Field of Classification Search .................. 428/343, 428/413, 418, 221, 332, 337
See application file for complete search history.

(56) References Cited

U.S. PATENT DOCUMENTS

|  |  |  |  |  |
|---|---|---|---|---|
| 295,220 | A | * | 3/1884 | Baker ........................... 428/343 |
| 2,668,348 | A |   | 2/1954 | Hubbell |
| 2,706,165 | A |   | 4/1955 | Korsgaard |
| 2,864,755 | A |   | 12/1958 | Rothacker |
| 3,293,733 | A |   | 12/1966 | Broverman et al. |
| 3,589,975 | A |   | 6/1971 | Andrews et al. |
| 3,647,592 | A |   | 3/1972 | Woodberry |
| 3,660,199 | A | * | 5/1972 | Riccitiello et al. ......... 156/307.1 |
| 3,664,890 | A |   | 5/1972 | Winter |

(Continued)

FOREIGN PATENT DOCUMENTS

EP    0 212 124 B1    3/1987

(Continued)

OTHER PUBLICATIONS

International Searching Authority, Notification of Transmittal of the International Search Report and the Written Opinion of the International Searching Authority, or the Declaration for Related Copending PCT Application No. PCT/US2008/078012, Feb. 13, 2009.

*Primary Examiner* — Callie Shosho
*Assistant Examiner* — Nicholas Kikkinos
(74) *Attorney, Agent, or Firm* — Knobbe, Martens, Olson & Bear, LLP

(57) ABSTRACT

An entry sheet comprising polymer material for drilling printed circuit boards is provided. The entry sheet is suitable for use with a broad range of diameters, including commonly available drill diameters. The entry sheet comprises an adhesive epoxy configured to, among others, resist drill deflection, resist mechanical damage, and reduce to dust such that the entry sheet may increase drilling accuracy, protect printed circuit board from damage, minimize entry burrs, and may addresses other issues such as fliers, bird nesting, and the like.

16 Claims, 10 Drawing Sheets

U.S. PATENT DOCUMENTS

| | | | |
|---|---|---|---|
| 3,700,341 A | 10/1972 | Block | |
| 3,779,770 A | 12/1973 | Alston et al. | |
| 3,784,440 A * | 1/1974 | Grunwald et al. | 428/417 |
| 3,832,731 A | 8/1974 | Kinsman | |
| 3,932,250 A | 1/1976 | Sato et al. | |
| 3,932,689 A * | 1/1976 | Watanabe et al. | 428/418 |
| 3,936,548 A | 2/1976 | Konicek | |
| 3,948,662 A | 4/1976 | Alston, Jr. et al. | |
| 3,948,701 A | 4/1976 | Fasbender et al. | |
| 3,955,068 A | 5/1976 | Shaheen | |
| 3,977,075 A | 8/1976 | Lynch et al. | |
| 3,984,598 A | 10/1976 | Sarazin et al. | |
| 4,019,826 A | 4/1977 | Block | |
| 4,022,648 A | 5/1977 | Woodberry et al. | |
| 4,092,925 A | 6/1978 | Fromson | |
| 4,104,667 A | 8/1978 | Scholz et al. | |
| 4,104,669 A | 8/1978 | Friedman | |
| RE29,820 E | 10/1978 | Konicek | |
| 4,179,324 A | 12/1979 | Kirkpatrick | |
| 4,180,608 A | 12/1979 | Del | |
| 4,183,137 A | 1/1980 | Lomerson | |
| 4,213,869 A | 7/1980 | Kosinsky | |
| 4,226,519 A | 10/1980 | Gervais et al. | |
| 4,269,549 A | 5/1981 | Block | |
| 4,311,419 A | 1/1982 | Block | |
| 4,316,322 A | 2/1982 | Tranberg | |
| 4,374,890 A * | 2/1983 | Shimizu et al. | 428/212 |
| 4,383,785 A | 5/1983 | Rice | |
| 4,446,188 A | 5/1984 | Patel et al. | |
| 4,455,181 A | 6/1984 | Lifshin et al. | |
| 4,463,234 A | 7/1984 | Bennewitz | |
| 4,477,512 A | 10/1984 | Thomas et al. | |
| 4,500,028 A | 2/1985 | Breedis et al. | |
| 4,501,787 A | 2/1985 | Marchetti et al. | |
| 4,519,732 A | 5/1985 | Sutcliffe | |
| 4,524,098 A | 6/1985 | Shimizu et al. | |
| 4,568,413 A | 2/1986 | Toth et al. | |
| 4,597,988 A | 7/1986 | Kukanskis et al. | |
| 4,599,134 A | 7/1986 | Babu et al. | |
| 4,680,897 A | 7/1987 | Daniels et al. | |
| 4,699,674 A | 10/1987 | Finnegan | |
| 4,715,116 A | 12/1987 | Thorpe et al. | |
| 4,722,765 A | 2/1988 | Ambros et al. | |
| 4,781,495 A | 11/1988 | Hatch et al. | |
| 4,781,969 A | 11/1988 | Kobayashi et al. | |
| 4,853,273 A | 8/1989 | Harris, Jr. | |
| 4,872,934 A | 10/1989 | Kameda | |
| 4,875,283 A | 10/1989 | Johnston | |
| 4,882,216 A * | 11/1989 | Takimoto et al. | 428/209 |
| 4,906,534 A | 3/1990 | Bekki et al. | |
| 4,929,370 A | 5/1990 | Hatch et al. | |
| 4,948,630 A * | 8/1990 | Courduvelis et al. | 427/444 |
| 4,954,200 A | 9/1990 | Trewiler | |
| 4,961,806 A | 10/1990 | Gerrie et al. | |
| 4,972,218 A | 11/1990 | Weissburg | |
| 5,057,372 A | 10/1991 | Imfeld et al. | |
| 5,067,859 A | 11/1991 | Korbonski | |
| 5,120,590 A | 6/1992 | Savage et al. | |
| 5,153,050 A | 10/1992 | Johnston | |
| 5,172,472 A | 12/1992 | Lindner et al. | |
| 5,179,770 A | 1/1993 | Block et al. | |
| 5,256,474 A | 10/1993 | Johnston | |
| 5,435,671 A | 7/1995 | Weinreich | |
| 5,480,269 A | 1/1996 | Ejiri et al. | |
| 5,507,603 A | 4/1996 | Nakano et al. | |
| 5,523,137 A | 6/1996 | Sei et al. | |
| 5,524,885 A | 6/1996 | Heo | |
| 5,674,596 A | 10/1997 | Johnston | |
| 5,692,940 A | 12/1997 | Kinbara et al. | |
| 5,716,168 A | 2/1998 | Janoff | |
| 5,785,465 A | 7/1998 | Korbonski | |
| 5,802,402 A | 9/1998 | Lippert et al. | |
| 5,948,526 A | 9/1999 | Wilheim et al. | |
| 5,961,255 A | 10/1999 | Korbonski | |
| 5,973,906 A | 10/1999 | Stevenson et al. | |
| 6,000,886 A | 12/1999 | Washio et al. | |
| 6,200,074 B1 | 3/2001 | Miller et al. | |
| 6,214,135 B1 | 4/2001 | Washio et al. | |
| 6,280,851 B1 | 8/2001 | Pasternack et al. | |
| 6,342,682 B1 | 1/2002 | Mori et al. | |
| 6,344,371 B2 | 2/2002 | Fischer et al. | |
| 6,565,295 B2 | 5/2003 | Ohashi et al. | |
| 6,783,860 B1 | 8/2004 | Frater | |
| 6,866,450 B2 * | 3/2005 | Hasaki et al. | 408/1 R |
| 6,890,664 B2 | 5/2005 | Kaburagi et al. | |
| 2002/0003991 A1 | 1/2002 | Ohashi et al. | |
| 2002/0085888 A1 | 7/2002 | Velpari et al. | |
| 2002/0123285 A1 | 9/2002 | Dana et al. | |
| 2003/0100456 A1 | 5/2003 | Hasaki et al. | |
| 2003/0129030 A1 | 7/2003 | Johnston | |
| 2004/0239982 A1 | 12/2004 | Gignac | |
| 2005/0064222 A1 | 3/2005 | Russell | |
| 2005/0112344 A1 * | 5/2005 | Redfern et al. | 428/213 |
| 2006/0216486 A1 | 9/2006 | Chen | |

FOREIGN PATENT DOCUMENTS

| | | |
|---|---|---|
| EP | 0 235 582 A2 | 9/1987 |
| EP | 0 264 816 A | 4/1988 |
| EP | 0 470 757 A | 2/1992 |
| EP | 0 570 448 | 7/1997 |
| EP | 0 642 297 B1 | 11/1999 |
| GB | 2 252 522 A | 8/1992 |
| GB | 2 273 898 A | 7/1994 |
| JP | 60155307 A | 8/1985 |
| JP | 02138446 A | 5/1990 |
| JP | 10335780 A | 12/1998 |
| WO | WO 81/00367 | 2/1981 |
| WO | WO 88/03743 | 5/1988 |
| WO | WO 92/14346 | 8/1992 |
| WO | WO 00/60911 | 10/2000 |
| WO | WO 2005/032468 | 4/2005 |
| WO | WO 2005/082402 | 9/2005 |

* cited by examiner

FIG. 5A

| Thickness (inches) | PCB Board | | | | | Insulating Material | Backup Board |
|---|---|---|---|---|---|---|---|
| | Layers | CU Weight (oz) Outer | Internal | Stack Height | | | |
| 0.118 | 2 | 1 | ? | 1 | | FR-4 | .093 in LCOA Tek |

| Entry Board | Thickness (in) | CpK | TPR |
|---|---|---|---|
| Improved Entry Sheet | 0.009 | 2.9300 | 0.00690 |
| LCOA EO+ | 0.012 | 1.5900 | 0.00126 |
| Aluminum | 0.007 | 2.3000 | 0.00126 |
| LE Sheet | 0.014 | 2.8200 | 0.00106 |

| Drilling Machine | | | | | |
|---|---|---|---|---|---|
| Name | Diameter (inches) | Feed (IPM) | Speed (RPM) | Retract (IPM) | Max Hits |
| Excellon Century | 0.0135 | 88 | 110000 | 800 | 200 |

FIG. 6

| | | | PCB Board | | | | |
|---|---|---|---|---|---|---|---|
| | | CU Weight (oz) | | | | | |
| Example | Thickness (inches) | Layers | Outer | Internal | Stack Height | Aspect Ratio | Insulating Material |
| 2 | 0.1100 | 26 | 0.5 | 2 | 1 | 11:1 | FR-406 |
| 3 | 0.098 | 18 | 0.2 | 1 | 1 | 12:4:1 | FR-406 |
| 4 | 0.095 | 2 | 1 | - | 1 | 12:1 | FR-406 |
| 5 | 0.062 | 2 | 1 | - | 1 | 8:1 | FR-408 |

| | Drilling Machine | | | | | | | |
|---|---|---|---|---|---|---|---|---|
| Example | Name | Diameter (inches) | Feed (IPM) | Speed (RPM) | Retract (IPM) | Max Hits | SFM | Chipload |
| 2 | Excellon Century 2001 | 0.0098 | 114 | 125000 | 600 | 2200 | 321 | 0.91 |
| 3 | Excellon Century 2001 | 0.0079 | 55 | 125000 | 700 | 1500 | 259 | 0.44 |
| 4 | Excellon Century 2001 | 0.0079 | 65 | 110000 | 800 | 2000 | 228 | 0.65 |
| 5 | Hitachi | 0.0079 | 79 | 120000 | 500 | 2000 | 248 | 0.66 |

| | ENTRY MATERIALS | | | | | | | | |
|---|---|---|---|---|---|---|---|---|---|
| | Improved Entry Sheet | | | | Comparative Entry Boards | | | | |
| Example | Thickness (inches) | Backup Board | CpK | TPR | Type | Thickness (in) | Backup Board | CpK | TPR |
| 2 | 0.009 | SlickBack | 0.91 | 0.00276 | LE Sheet | | STARboard | 0.56 | 0.00355 |
| 3 | 0.009 | SlickBack | 0.92 | 0.00226 | LE Sheet | | STARboard | 0.53 | 0.0031 |
| 4 | 0.009 | Spectrum Gold | 1.76 | 0.00160 | Aluminum | (.007 in) | Spectrum Gold | 1.36 | 0.00291 |
| 5 | 0.009 | Spectrum Gold | 1.66 | 0.00150 | Aluminum | (.007 in) | Spectrum Gold | 1.11 | 0.00244 |

FIG. 7A

| Thickness (inches) | Layers | | Stack Height | Insulating Material |
|---|---|---|---|---|
| | Outer | Internal | | |
| 0.093 | 2 | - | 0.5 | 1 | FR-4(TTM-SA) |

PCB Board
CU Weight (oz)

Drilling Machine

| Name | Diameter (inches) | Feed (IPM) | Speed (RPM) | Retract (IPM) | Max Hits | SFM | Chipload |
|---|---|---|---|---|---|---|---|
| Hitachi | 0.0098 | 87 | 125000 | 700 | 2020 | | |

.009 inch Improved Entry Sheet with SlickBack back up board

| CpK | TPR |
|---|---|
| 2.61 | 0.00128 |
| 1.47 | 0.00167 |
| 1.94 | 0.00145 |
| 1.56 | 0.00156 |
| 1.83 | 0.00142 |
| 1.03 | 0.00182 |

.007 inch Aluminum with SlickBack backup board

| CpK | TPR |
|---|---|
| 1.00 | 0.00200 |
| 0.75 | 0.00216 |
| 1.18 | 0.00209 |
| 0.67 | 0.00243 |
| 0.67 | 0.00290 |
| 0.52 | 0.00294 | ved to create holes in PCBs, can cause defects in the

SYSTEMS AND METHODS FOR DRILLING HOLES IN PRINTED CIRCUIT BOARDS

CROSS-REFERENCE TO RELATED APPLICATIONS

The present patent application claims the priority benefit of U.S. Provisional Application 60/976,264, filed on Sep. 28, 2007, titled "COATED ENTRY BOARD," the entire content of which is hereby expressly incorporated by reference.

BACKGROUND

1. Field of the Present Application

The disclosure of the present application generally relates to the fabrication of printed circuit boards, and more particularly to entry sheets for drilling holes in printed circuit boards.

2. Description of the Related Art

Holes are drilled in electrical interconnect systems such as printed circuit boards (PCBs) for various purposes, including to accommodate component leads, interconnect different layers of PCBs, etc. Several problems are associated with drilling holes in PCBs. Entry burrs, the waste substance that is removed to create holes in PCBs, can cause defects in the holes, such as, for example, blowholes and voids, by rolling into barrels of the holes. Drilling can also cause damage to top surfaces of a stack of PCBs, for example, when the pressure foot of a drilling machine impacts the PCBs, thereby damaging the top surfaces of the PCBs. Drill accuracy is also factor to consider during drilling. Ideally, for example, a hole at the top of a stack of PCBs is aligned to a corresponding hole at the bottom of the stack of PCBs. The top hole and the bottom hole can be misaligned for various reasons, including, for example, due to inaccurate positioning of drill spindles relative to the drill axis upon entering the top surface of PCBs. The position of the drill point upon entering the top of the stack of PCBs can affect the location of the hole at the bottom of the stack. The closer to the center of the top hole the drill enters the sack of PCBs, the better the location of the corresponding bottom hole. Further, the drill spindle in some situations may be deflected from its true position, thereby adversely affecting the position of the bottom hole, and decreasing drilling accuracy.

To address some of the aforementioned drilling problems, entry boards are typically provided over PCBs as intermediate layers through which drill spindles advance prior to drilling various layers of PCBs. However, some entry boards are only effective for certain drill diameters. Others fail to provide a satisfactorily solution to all of the major issues associated with drilling. For example, although some entry boards generally improve drilling accuracy, the quality and location of the holes can benefit from even more improved accuracy. The present application provides improved systems and methods that attempt to effectively address these and other issues, for example, without limitation, by minimizing entry burring, protecting PCBs from damage, and/or improving drilling accuracy, etc.

SUMMARY

In one embodiment, an entry sheet for drilling circuit boards is disclosed, the entry sheet comprising: a substrate layer having a thickness of about 6 mils or less; and an entry sheet component provided over the substrate layer, wherein the entry sheet component has a thickness of about 6 mils or less.

In another embodiment, an entry sheet for drilling circuit boards comprises an entry sheet component configured to be used with drill diameters in the range of about 6.7 mm or less, wherein the entry sheet component comprises an adhesive.

In accordance to one embodiment, a method of drilling circuit boards comprises providing an entry sheet having a thickness of about 12 mils or less, wherein providing the entry sheet further comprises providing an entry sheet component comprising an adhesive epoxy and having a thickness of about 6 mils or less over a substrate layer having a thickness of about 6 mils or less; and drilling the entry sheet and the circuit boards in succession to create holes in the circuit boards.

Further still in one embodiment, a method of manufacturing an entry sheet for drilling circuit boards comprises providing a substrate layer; forming an entry sheet component by combining polymer material comprising about 55-95% by weight of bisphenol a/digycidyl epoxy resin with curing agents; and providing the entry sheet component over the substrate.

Further still in one embodiment, a method of manufacturing an entry sheet for drilling circuit boards comprises providing a substrate layer; forming an entry sheet component by combining polymer material comprising about 55-95% by weight of bisphenol a/digycidyl epoxy resin with curing agents; and providing the entry sheet component over the substrate.

In one embodiment, an entry sheet for drilling circuit boards comprises an entry sheet component, wherein the entry sheet component has a thickness of about 3-6 mils.

In one embodiment, an entry sheet for drilling circuit boards comprises an entry sheet component and a substrate component having a thickness of about 1-6 mils, wherein the entry sheet has a thickness of about 4-12 mils.

In another embodiment, an entry sheet for drilling circuit boards comprises an entry sheet component, wherein adhesives comprise a substantial portion of the entry sheet component.

BRIEF DESCRIPTION OF THE DRAWINGS

These and other features will now be described with reference to the drawings summarized below. These drawings and the associated description are provided to illustrate one or more preferred embodiments of the invention and not to limit the scope of the invention.

FIG. 5A is a table showing drill parameters and accuracy measurements of test drill runs comparing the performance of the improved entry sheet with that of other commonly available entry boards.

FIG. 6 is a table illustrating drill parameters and accuracy measurements of test drill runs comparing the performance of the improved entry sheet with other entry boards.

FIG. 7A is a table illustrating drill parameters and accuracy measurements of test drill runs comparing the performance of the entry sheet with an aluminum entry board.

DETAILED DESCRIPTION

Figure 1:
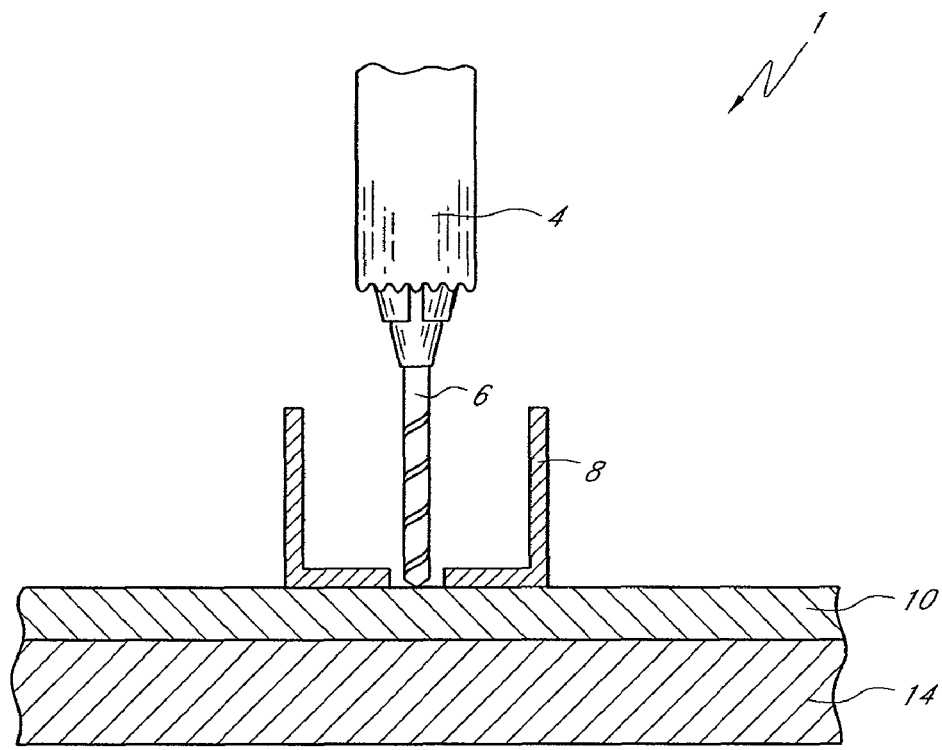
FIG. 1 illustrates a system in which a drilling machine is arranged to drill a printed circuit board overlaid with an improved entry sheet.

In describing various embodiments of the present invention related to methods, systems and materials for use in printed circuit board drilling applications, reference will be made herein to FIGS. 1-7 of the drawings in which like numerals refer to like features.

A. General Description of Non-Limiting Embodiments

The terms "printed circuit board," "PCB" or "electrical interconnect systems" as used in the present patent application are interchangeable and are broadly defined and comprise, without limitation, any and all systems that provide, among others, mechanical support to electrical components, electrical connection to and between these electrical components, or the like. PCBs comprise systems that generally include a base platform to support the electrical components (for example, a thin board of insulating material) and conductors such as conductive pathways, surfaces, solderable attachments, and the like interconnect the electrical components. PCBs can employ a broad range of technologies to support the electrical components (for example, through-hole, surface-mount, mixed-technology, component mounted on one or both sides, etc.) and can comprise a wide range of single or multi-layer constructions (for example, single-sided, double-sided, multilayer, flexible, rigid-flex, stripline, etc). The terms broadly describe PCBs at any stage of the manufacturing process, including, for example, multiple PCBs configured into a stack structure to be drilled by drilling machines.

As used herein, "electronic components" broadly defines any device capable of handling electricity and includes systems comprising, for example, digital, analog, analogue-digital, radio frequency, microwave, etc. circuitry and comprises a wide range of electrical systems such as, without limitation, electrical devices, electronic devices, electronic circuits, electrical elements, integrated circuits, hybrid systems, or the like.

As used herein, "entry sheet" is a broad term used in its ordinary sense and includes, without limitation, components provided over the top, at the bottom, and/or within a stack of printed circuit boards during drilling applications, for example, to facilitate drilling holes in the PCBs. Entry sheets are provided over one or more PCBs during the drilling process generally, among others, to protect the PCBs, drilling machines and/or their subcomponents from various types of damage arising from the drilling process, to minimize entry burrs, to increase the accuracy with which the holes are drilled in the PCBs, etc. Entry sheets are adapted to first accept drill spindles, parts of drilling machines that penetrate PCBs to form holes in the PCBs, before the drill spindles drills the PCBs. An entry sheet can comprise one entry sheet layer or a two or more entry sheet layers. In a multi-entry sheet layer configuration, an entry sheet layer can be provided over another entry sheet layer to form a laminate of the two entry sheet layers using various lamination techniques, such as, for example, adhesives, "cast to foil" process, sputtering, plating, rolling, spraying, etc.

"Entry sheet layer," as used herein, broadly refers to entry sheet subcomponents generally formed from material processed into a thin layer or shape such as a sheet, a film, a foil, or the like. "Entry sheet layer" is broadly defined and comprises a wide variety of entry sheet layer constructions such as, without limitation, substrates, boards, coatings, adhesives, conductive plates, cores, outer shells, lubricants, masks, resist layers, and the like. In some embodiments, the entry sheet layers can be substantially separate and distinct layers. A broad range of materials can be used to manufacture entry sheet layers, including, without limitation, ceramics, fluids (for example, lubricants and solvents), metals, other engineering materials such as additives and fillers, polymers, wood and other natural products, a combination of the above and/or other materials, and the like.

As used herein, "substrate layer" broadly defines an optional entry sheet layer made from relatively rigid materials. The substrate layer comprises a broad range of relatively rigid materials, including, by way of non-limiting examples, papers, cotton fabric, asbestos, ceramic material, molybdenum, plastic, glass, glass in various forms such as cloth and continuous filament mat, other organic substances, a combination of the above materials, a combination of one or more of the above materials with other materials, etc.

"Adhesive" or "adhesive material" as used herein broadly refer to components and/or materials having uniting or bonding characteristics and also includes adhesive materials, which can be shaped into thin sheets or layers, typically employed for attaching and/or laminating various substructures of multi-layer systems such as circuit boards, PCBs, electrical interconnect systems, entry boards, entry sheets, exit boards, etc. "Adhesive" and "adhesive material" comprise materials used to bond various multi-layer system substructures such as, for example, insulating and/or conducting layers, substrates, boards, surface layers, coatings, masks, or other subcomponents of multi-layer systems. Adhesives comprise a broad range of materials, including polymer materials such as, without limitation, epoxies, acrylics, polyimides, modified polyesters, butyral phenolics, other types of resins, or the like. As used herein, adhesives can be used as entry sheet layers in entry sheets and can be configured to reduce entry burrs, protect PCBs, and/or increase drilling accuracy of PCBs. In some embodiments, adhesives are epoxies.

As used in the present application, "drill axis" generally refers to an imaginary straight line through the center of a hole to be drilled on PCBs. It is desired for a drill spindle to maintain its position along the drill axis as the drill spindle advances through entry sheets and/or PCBs such that the drill spindle can create holes in accurate locations. The terms "drill deflection" or "drill spindle deflect" or "lateral deflection" or "out of position" generally refer to any undesirable deviation, in any direction, of the drill spindle away from a straight course along the drill axis that typically causes the drill spindle, among others, to drill holes in inaccurate positions and/or cause defects in PCBs. As used herein, the terms "drilling" and "drilling applications" are broad terms used in their ordinary sense and include, without limitation, a process of forming holes or channels in a PCB or a stack of PCBs.

The term "dust" as used herein broadly refers to any material, including materials employed to manufacture the entry sheet and/or PCB, that is reduced in size, for example, to dry powdery material. Dust can be sufficiently small in size such that the dust can be readily evacuated from drilling systems using, for example, a drill vacuum.

As used herein, "epoxy resin" broadly refers to thermosetting epoxide polymer materials that are capable of hardening or becoming more solid, for example, when cured. Epoxy resin broadly defines multi-component epoxy systems, including two-component epoxy systems, in which a first component comprising epoxy resins is cured into a more solid state by combining the first component with a second component comprising curing agents. Further, "epoxy resin" as used herein also broadly defines single-component systems in which a solution comprising epoxy resin is capable of curing without the need to combine the solution with another solution comprising curing agents. Generally, "epoxy," "epoxies," "epoxy material" broadly refer to polymer material comprising epoxy resin that has partially, substantially, or fully cured.

As used herein, "curing" or "cured" or "cure" broadly defines the process of polymerizing, toughening and/or hardening polymer material by combining polymers such as epoxies with curing agents or by subjecting polymers to other curing processes such as heat, pressure, radiation, or the like. "Curing agents" or "curing materials" broadly defines substances or mixtures of substances added to polymer materials to promote or control the curing process. Curing agents may comprise non-curing substances. Polymer material can be uncured, partially cured in which the hardening process has begun but is not complete, or fully cured wherein the epoxy resin in the polymer material has substantially or completely hardened.

Preferably drilling applications utilizing entry sheets as disclosed herein may demonstrate one or more of the following characteristics: improved thru-hole or blind hole (for example, decreased roughness) quality, minimal to no burring, improved drill accuracy, prolonged drill life, decreased drilling temperature, improved ability to increase amount of PCBs drilled at once, and improved ability to drill through PCBs that are typically becoming more difficult to drill through due to increased thicknesses of the PCBs and/or more abrasive circuit board components containing higher $T_g$ materials.

B. Detailed Disclosure of Non-Limiting Embodiments

FIG. 1 illustrates one embodiment of a drilling system 1 in which a drilling machine 4 is configured to drill through an entry sheet and at least one electrical interconnect system such as a printed circuit board (PCB) 14. The PCB 14 is overlaid with an improved entry sheet 10 configured to reduce or eliminate several problems associated with drilling holes in the PCB 14, such as, for example, scarring, bird nesting, fliers, burring, etc. The drilling machine 4 includes a rotating drilling spindle 6 to carry out the drilling and can include a pressure foot 8, for example, to secure the improved entry sheet 10 and/or the PCB 14 in position. With the improved entry sheet 10 provided over the PCB 14 and the pressure foot 8 securing the PCB 14 in position, the drill spindle 6 advances through the polymer sheet 10 and the PCB 14 in succession to thereby create holes in the PCB 14.

As shown in FIG. 1, the improved entry sheet 10 is configured to be used in connection with drilling a broad range of drill diameters, including all commonly available drill diameters. In one embodiment, the improved entry sheet 10 is configured to be used with drill diameters measuring about 6.7 millimeters (mm) or less. In the preferred embodiment, the improved entry sheet 10 is configured to be used with drill diameters in the range of about 0.10-6.7 mm. In other embodiments, the improved entry sheet 10 can be used with different drill diameters including drill diameters much less than 0.10 mm and much larger than 6.7 mm. Some PCB handlers do not use common entry boards when drilling holes having diameters of 0.25 mm or less because, among others reasons, the common entry boards often break the smaller-sized drill spindles. The improved entry sheet 10 is advantageously sufficiently thin such that the improved entry sheet 10 can be used for drill diameters of 0.25 mm or less, thereby enabling the improved entry sheet 10 to provide benefits to the PCBs drilled with those drill diameters, including protecting PCBs from damage, minimizing entry burrs, increasing accuracy of drilled holes, and the like.

In the preferred embodiments, the improved entry sheet 10 is configured to have a thickness of about 12 mils (1 mil=1/1000 inch) or less. In certain preferred embodiments, the improved entry sheet 10 has a thickness in the range of about 3 mils to 12 mils. Having the improved entry sheet 10 that can be as thin as 3 mils allows the entry sheet 10, among other benefits, to be used with smaller drill diameters. In other arrangements, the improved entry sheet 10 has a thickness in the range of about 3-10 mils, including 3-8 mils, 3-6 mils, 4-12 mils, 4-10 mils, 4-8 mils, 4-6 mils, etc. In still other embodiments, the improved entry sheet 10 has a thickness of more than 12 mils, such as, for example, 13 mils, 14 mils, 15 mils, etc.

Figure 2:
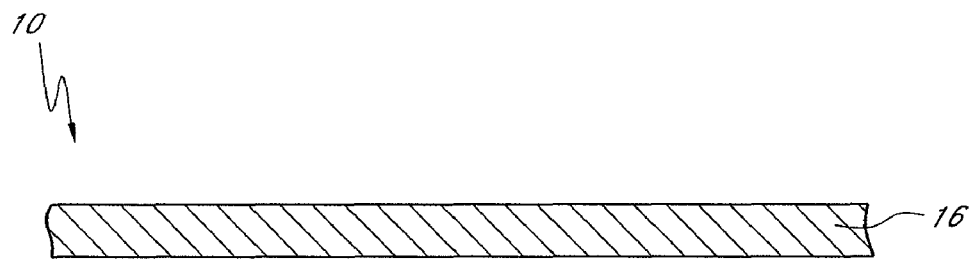
FIG. 2 depicts one embodiment of the improved entry sheet.

FIG. 2 illustrates one embodiment of the entry sheet 10 of FIG. 1 configured to be provided over the PCB 14. As shown in FIG. 2, the improved entry sheet 10 comprises one entry sheet layer, an improved entry sheet component 16. In one embodiment, the entry sheet 10 only comprises the improved entry sheet component 16. In other preferred embodiments, the entry sheet 10 comprising substantially separate and distinct layer of the improved entry sheet component 16 is used. In other embodiments, the entry sheet 10 comprises the improved entry sheet component 16 and other entry sheet layers. The entry sheet 10 of FIG. 1 can be configured to comprise the entry sheet component 16 made from adhesive material, including adhesive epoxies. In some embodiments, the entry sheet component 16 is configured such that adhesive material forms a substantial portion of the entry sheet component 16. The entry sheet component 16 preferably is configured to have a thickness of about 6 mils or less. In other embodiments, the entry sheet component 16 has a thickness in the range of about 3-6 mils, including 3-4 mils, 3-5 mils, 4-6 mils, and 4-5 mils. In other arrangements, the entry sheet component 16 can have thicknesses much less than 3 mils and/or much greater than 6 mils, including, without limitation, 1 mil, 2 mils, 7 mils, 8 mils, etc.

Still referring to FIG. 2, the improved entry sheet component 16 is preferably configured to be used in connection with drilling a broad range of drill diameters, including all commonly available drill diameters. In one embodiment, the improved entry sheet component 16 is configured to be used with drill diameters measuring about 6.7 mm or less. In another embodiment, the improved entry sheet component 16 is configured to be used with drill diameters in the range of about 0.10-6.7 mm. In other embodiments, the improved entry sheet component 16 can be used with different drill diameters including drill diameters much less than 0.10 mm and much larger than 6.7 mm.

As will be further discussed in connection with several embodiments, the improved entry sheet component 16 provides several advantageous, including, without limitation, protecting the top surface of the PCB 14, for example, by serving as a protective intermediate layer that separates the PCB 14 from the drill machine 4. In one embodiment, the improved entry sheet component 16 is configured to be sufficiently resilient so as to protect the PCB 14 from mechanical damage, including damage arising from pressure or stress exerted onto the PCB 14 by the drill machine 4 or the pressure foot 8. The improved entry sheet component 16 can be configured to readily conform to top surfaces of the PCB 14 such that the improved entry sheet component 16 minimizes entry burrs, the outwardly projectile scrap materials located at edges of drilled holes that form as the drill spindle 6 penetrates the PCB 14 to create holes therein. In another embodiment, the improved entry sheet component 16 advantageously comprises colored material, including bright green material, providing superior visualization before, during and after drilling.

The improved entry sheet component 16 of FIG. 2 also increases drilling accuracy by, among others, enabling the drill spindle 6 to maintain location of drilled holes from the entry side to the exit side of the PCB 14, as will be further discussed herein. The improved entry sheet component 16 configured to improve the drilling accuracy of the drill machine 4 enables the drill machine 4 to drill PCBs having increased stack heights. Drilling accuracy typically decreases as the aspect ratio (proportion of PCB thickness to diameter of the drilled holes) increases. The entry sheet component 16, which increases drill accuracy as will be further discussed, advantageously allows increased aspect ratios, allowing drilling of increasingly thicker PCBs having increasing number of layers with decreasing drill diameters.

Figure 3A:
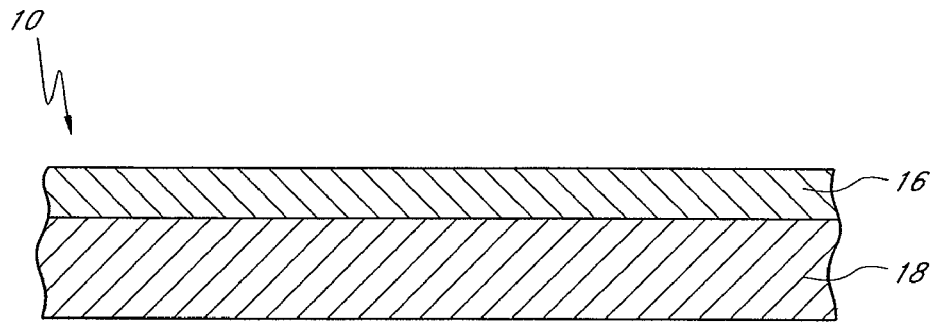
FIG. 3A is another non-limiting embodiment of the improved entry sheet.

Turning now to FIG. 3A, one preferred embodiment of the entry sheet 10 is disclosed wherein the entry sheet 10 comprises two entry sheet layers, the improved entry sheet component 16 and an optional substrate layer 18. As shown in FIG. 3A, the improved entry sheet component 16 is provided over the substrate layer 18. In one embodiment, the substrate layer 18 is provided over the PCB 14 and the improved entry sheet component 16 is provided over the substrate layer 18. The entry sheet 10 comprising the improved entry sheet component 16 and the substrate layer 18 is provided over the PCB 14 and the drilling spindle 6 drills through the entry sheet 10 and the PCB 14 in succession to create holes in the PCB 14.

As shown in FIG. 3A, the substrate layer 18 in the preferred embodiment is configured to have a thickness of less than about 6 mils. In the preferred embodiment, the substrate layer 18 can comprise a thickness in the range of 1-6 mils, including 1-4 mils, 1-3 mils, 1-2 mils, 2-6 mils, 2-5, 2-4 mils, etc. In other embodiments, the substrate layer 18 has thickness of much less than 1 mil and/or much larger than 6 mils, including 7 mils, 8 mils, 9 mils, etc. Thus, the entry sheet 10 comprising the entry sheet component 16 provided over the substrate layer 18 is configured to have a thickness of about 12 mils (1 mil=$\frac{1}{1000}$ inch) or less. In certain preferred embodiments, the entry sheet 10 has a thickness in the range of about 4 mils to 12 mils. In other arrangements, the entry sheet 10 has a thickness in the range of about 4-10 mils, including 4-8 mils, 4-6 mils, 5-12 mils, 5-10 mils, 5-8 mils, 5-7 mils, etc. In still other embodiments, the improved entry sheet 10 has a thickness of more than 12 mils, such as, for example, 13 mils, 14 mils, 15 mils, etc.

In one embodiment, the substrate layer 18 is sufficiently thin so as to not to interfere with the progression of the drill spindle 6 through the improved entry sheet 10 or the PCB 14. The substrate layer 18 is advantageously configured to be thin such that as the drill spindle 6 advances through the entry sheet 10, the substrate layer 18 does not form a bird nest at, near or around the tip of the drill spindle 6. In the preferred embodiment, the substrate layer 18 is configured to be used with drill diameters measuring about 6.7 mm or less. In another embodiment, the substrate layer 18 is configured to be used with drill diameters in the range of about 0.10-6.7 mm. In other embodiments, the substrate layer 18 can be used with different drill diameters, including drill diameters much less than 0.10 mm and/or much larger than 6.7 mm.

As shown in FIG. 3A, the substrate layer 18 can comprise relatively rigid materials, such as, for example, metals. In the preferred embodiment, the substrate layer 18 comprises aluminum. In one embodiment, the substrate layer 18 comprises other materials, including, without limitation, papers, cotton fabric, asbestos sheet, ceramic material, molybdenum, other types of plastic, glass in various forms such as cloth and continuous filament mat, etc. The substrate layer 18 can also comprise corn paper, soy paper, or other organic substances. In one embodiment, the substrate layer 18 comprises one or more of the following: high-density fiberboard, medium density fiberboard, metal, metal alloys, paper, melamine, random fiber mats, plastic, chip board, particle board, phenolic, phenolic supported with paper, cloth, or glass fiber, solid phenolic sheets, laminated phenolic sheets. Additionally, by incorporating a stable component such as the substrate layer 18, the entry sheet 10 has increased overall stability and rigidity that results in improved handling characteristics and a reduction in burring and warpage or bending. As one of skill in the art will appreciate, these characteristics will benefit the drilling process.

Several other materials or mixes of materials can be used to produce the substrate layer 18. In certain arrangements, the substrate layer 18 comprises flame retardant (FR) pregregs such as, without limitation, FR-2 (cellulose paper impregnated with phenolic resin), FR-3 (cotton paper impregnated with epoxy resin), FR-4 (epoxy-resin impregnated woven glass cloth), FR-5 (woven glass impregnated with epoxy resin), etc. More non-limiting embodiments of the substrate layer 18 that may be used and configured as described herein can be found, for example, on page 8, in the above-specified U.S. Provisional App. No. 60/976,264, which is incorporated by reference herein in its entirety.

With continued reference to FIG. 3A, the entry sheet 10 comprises the substrate layer 18 configured to minimize entry burrs from occurring during the drilling of the PCB 14. In some embodiments, the substrate layer 18 is configured to provide structural support to the entry sheet component 16. The substrate layer 18 can be configured to protect the top surfaces of the PCB 14 from getting damaged during the drilling process, for example, by the drilling machine 4 or components of the drilling machine 4 such as the drill foot 8. In some embodiments, the substrate layer 18 comprises relatively rigid materials to sufficiently prevent the drilling machine 4 from impacting one or more layers of the PCB 14.

Still with respect to FIG. 3A, the entry sheet component 16 and the substrate layer 18, the substrate layer 18 being optional in some preferred embodiments, can be manufactured using various techniques. In one arrangement, the substrate layer 18 is first provided. The entry sheet component 16 is provided over the substrate layer 18 to form the entry sheet 10. The entry sheet 10 is provided over PCBs, and the drilling machine 14 drills through the entry sheet 10 and the PCBs 14 in succession to create holes in the PCBs.

In one embodiment, providing the substrate layer 18 comprises selecting suitable material such as aluminum to form the substrate layer 18. Providing the entry sheet component 16 comprises selecting suitable entry sheet component material, including polymer material such as epoxy resin as described herein, and processing the suitable entry sheet component material to form the entry sheet component 16. Processing the suitable entry sheet component material can comprise partially, substantially, or fully curing one polymer material comprising an epoxy resin. In one embodiment, the polymer material comprising epoxy is cured by curing agents such as amine. Providing the entry sheet component 16 also comprises providing an adhesive material, including adhesive material made by curing polymer material such as epoxy resins. In one embodiment, providing the entry sheet component 16 over the substrate layer 18 comprises forming the entry sheet component 16 onto the substrate layer 18 (for example, coating, depositing, and/or placing the entry sheet component 16 onto the substrate layer 18). Providing the entry sheet component 16 over the substrate layer 18 comprises coating, for example, spray-coating (using air or electroless spraying) the entry sheet component 16 onto the substrate layer 18 in a reel-to-reel process. In another configuration, the entry sheet component 16 is roller coated onto the substrate layer 18, for example, in a conveyor process.

Still in reference to FIG. 3A, the entry sheet component 16 can be provided over the substrate layer 18 and attached to the substrate layer 18 using an adhesive layer (not shown). In one embodiment, the entry sheet component 16 and the substrate layer 18 are formed using the "cast to foil" process wherein polymer material, including in liquid form, is applied over the substrate layer 18, and the polymer material and the substrate layer 18 are then heated, resulting in a film of the entry sheet component 16 formed on the substrate layer 18. In other embodiments, suitable substrate materials are deposited onto the entry sheet component 16, for example, by sputtering the suitable substrate materials from a copper cathode. In still other embodiments, the entry sheet component 16 is provided over the substrate layer 18 using a plating process (depositing the substrate layer 18 on the entry sheet component 16). In other embodiments, suitable substrate material such as aluminum is vaporized in a vacuum chamber and the vapor is deposited on the entry sheet component 16, thereby providing the entry sheet component 16 over the substrate layer 18. In still other embodiments, the entry sheet component 16 can be provided over the substrate layer 18 using other techniques such as curtain coating, crotch coating, slot-die coating, etc.

In the preferred embodiment, forming the entry sheet 10 comprises substantially or fully curing the entry sheet 10, for example, by passing the entry sheet component 16 and the substrate layer 18 through one or more irradiation beams or ovens, for example, as the entry sheet 10 passes through a manufacturing line. In accordance with other embodiments, forming the entry sheet 10 comprises partially curing laminates of the entry sheet component 16 and the substrate layer 18. Other non-limiting embodiments of the methods of manufacturing the improved entry sheet component 16 that may be used and configured as described herein can be found, for example, on page 9, in the above-specified U.S. Provisional App. No. 60/976,264, which is incorporated by reference herein in its entirety.

Figure 3B:
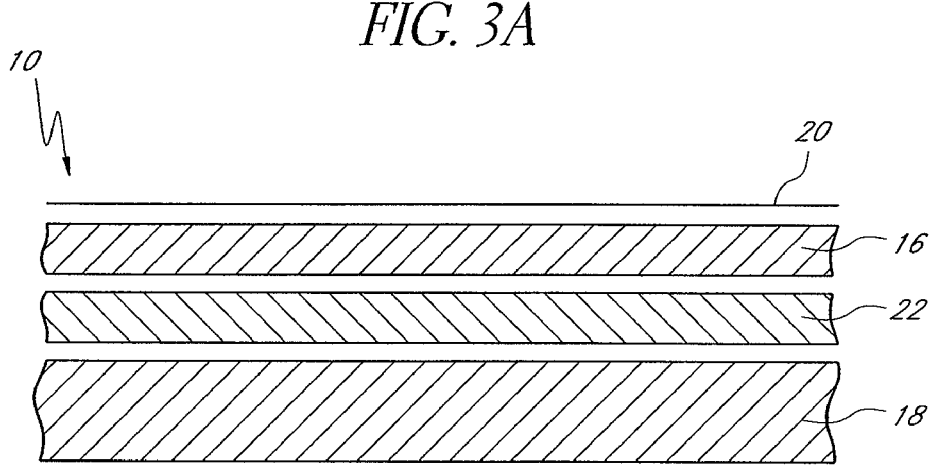
FIG. 3B is another non-limiting embodiment of the improved entry sheet.
Figure 3C:
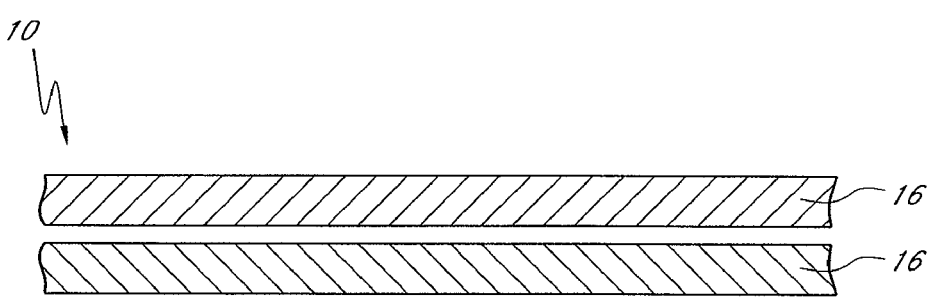
FIG. 3C is another non-limiting embodiment of the improved entry sheet.
Figure 3D:
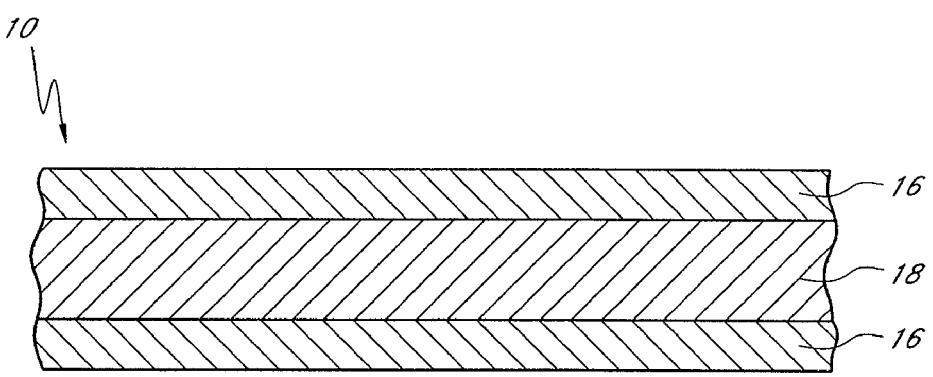
FIG. 3D is another non-limiting embodiment of the improved entry sheet.

Now turning to FIG. 3B, another embodiment of the entry sheet 10 comprising two or more entry sheet layers is disclosed. As shown in FIG. 3B, the improved entry sheet 10 comprises an optional top coat 20, the entry sheet component 16, an optional adhesive layer 22, and the substrate layer 18. The optional top coat 20 can be configured to reduce, among others, any surface materials that project outwardly from the top surface of the entry sheet component 16 during drilling, including any imperfections in the entry sheet component 16 that, for example, arise from undercuring of the entry sheet component 16 and/or other entry sheet layers of the entry sheet 10. The optional top coat 20 can further be configured to enhance the appearance of the improved entry sheet component 16. In some embodiments, the optional top coat 20 can provide a protective surface over the improved entry sheet 10 so as to minimize the improved entry sheet 10 from sustaining damage during processes related to drilling PCBs such as during transporting the entry sheet component 16.

As discussed herein in connection with FIG. 3A, various techniques can be employed to bond the entry sheet component 16 and the substrate layer 18, including spray coating, roller coating, curtain coating, crotch coating, slot die coating, and the like. In other embodiments and as shown in FIG. 3B, the optional adhesive layer 22 can be employed to attach the entry sheet component 16 to the substrate layer 18. The optional adhesive layer 22 is configured is different from the entry sheet component 16 that comprises adhesive material in that the optional adhesive layer 22 is configured to laminate or attach entry sheet layers of the entry sheet 10. In some embodiments, the optional adhesive layer 22 is much thinner in thickness than the entry sheet component 16. The optional adhesive layer 22 can comprise various adhesive materials, including, without limitation, acrylic materials, polyimides, epoxies, polyesters, phenolic materials, etc. Further non-limiting embodiments of the improved entry sheet component 16 comprising optional layers that may be used and configured as described herein can be found in the above-specified U.S. Provisional App. No. 60/976,264, which is incorporated by reference herein in its entirety.

Although FIGS. 1-3B show the entry sheet 10 in particular configurations, the entry sheet 10 can be provided over PCB 14 in other configurations. By way of non-limiting examples, FIG. 3C shows the entry sheet 10 comprising two or more entry sheet layers. Although FIG. 3C illustrates the entry sheet 10 comprising one improved entry sheet component 16 provided over another entry sheet component 16, skilled artisans appreciate that the entry sheet 10 can comprise the entry sheet component 16 provided over one or more other types of entry sheet layer. In other embodiments, the entry sheet 10 can comprise two or more entry sheet layers provided over the entry sheet component 16. In accordance with one embodiment as shown in FIG. 3D, the entry sheet 10 comprises the improved entry sheet component 16 provided over the optional substrate layer 18, the optional substrate layer 18 further provided over another entry sheet component 16. In another embodiment, the entry sheet component 16 can comprise two or more substrate layers 18. In still other embodiments, the improved entry sheet 10 can comprise other optional layers, including, without limitation, coatings, adhesives, lubricants, substrates, solvents, other types of laminates, and/or the like. In still other embodiments, the entry sheet 10 can comprise one or more of the entry sheet component 16 interspersed throughout the entry sheet 10 among the other optional layers.

C. Materials

As disclosed in connection with FIGS. 1-3D, the improved entry sheet 10 comprises at least the improved entry sheet component 16. The improved entry sheet component 16 can comprise a wide range of materials, such as, without limitation, ceramics, fluids, metals, polymers, woods, and the like. The improved entry sheet component 16 can comprise other materials such as fillers, additives, catalysis, fibers, semiconductors, or the like. In the preferred embodiment, the improved entry sheet component 16 comprises polymer material, such as, for example, epoxies. The improved entry sheet component 16 comprising epoxies, such as adhesive epoxies, provides several advantages, as will be discussed herein.

The preferred entry sheet component 16 preferably comprises materials that demonstrate one or more of the following characteristics depending on the application: does not interfere with the drill spindle 8; prevents or reduces bird nesting; resists mechanical damage; creates bushings that improve drilling accuracy; resists lateral deflection of the drill spindle 6; is easy to handle; is stable (for example, does not substantially degrade during the life of the product).

In the preferred embodiments, the entry sheet component 16 advantageously comprises material, including polymer material or adhesive material, configured to restrain undesirable deflection of the drill spindle 6 in directions away from the drill axis as the drill spindle 6 advances through the entry sheet 10 and/or the PCB 14, thereby increasing drilling accuracy. In commonly available entry boards, the drill spindle 6 typically takes a number of revolutions, for example, one, two, three or more revolutions, after entering top surfaces of entry boards and before settling into a desired position, for example, along an axis through the center of the hole to be drilled. Bushings, cylindrical linings formed from entry sheet material around the drill spindle 6 as the drill spindle 6 advances through the entry sheet component 16 and/or the PCB 14, created during the first few revolutions before the drill spindle 6 is fully positioned at or near the center of the hole to be drilled typically are imperfect and do not effectively restrain the lateral motion of the drill spindle 6 along the drill axis, which can result in a lateral deflection of the drill spindle 6. The entry sheet component 16 thus advantageously comprise material, including polymer material such as epoxy, sufficiently strong to hold the drill spindle 6 in position along the drill axis immediately upon or shortly after the drill spindle 6 comes to contact with the entry sheet component 16, creating bushings capable of restraining the drill spindle 6 in position along the desired axis through the center of the hole to be drilled, minimizing or eliminating any lateral deflection and increasing drilling accuracy.

In accordance with one embodiment disclosed herein, the improved entry sheet component 16 comprises material, including adhesives or polymer material such as epoxy, sufficiently resistant to mechanical and other types of damage such as scratches, dents, or the like that are caused by, for example, the drill machine 4 and/or the drill foot 8. In one embodiment, the improved entry sheet component 16 is also configured to resist damage caused by debris, any substance in the drilling system 1 that interferes with the drilling process. "Debris" or "waste substances" broadly define substances present in the drilling system 1 that interfere with the drilling process and include, for example, dust particles, entry sheet and/or PCB materials that are removed as holes are created therein, or the like. Debris can cause mechanical damages on top surfaces or other portions of common entry boards that can deflect the drill spindle 6 out of position, causing the drill spindle 6 to drill holes in an inaccurate position or to otherwise damage existing holes or other parts of the PCB 14. In other circumstances, debris cause substantial hole defects which can lead to fliers, a common problem in which defects even in just a few holes (for example, a few out of 50,000 holes) can render the entire PCB inoperable. The improved entry sheet component 16 is advantageously configured to resist various types of damage, including mechanical damage, thereby minimizing undesired deflection of the drill spindle 6 arising from such damage.

In some embodiments, the improved entry sheet component 16 is advantageously configured to readily reduce to dust during the drilling process. In one embodiment, the entry sheet component 16 comprises material, including adhesives and/or polymer material such as epoxies, which readily reduces to dust during the drilling process to thereby eliminate or minimize a common problem known as bird nesting. Bird nesting occurs when entry sheet materials fail to sufficiently degrade to dust as the drill spindle 6 advances through the entry boards, and waste substance accumulates around the tip of the drill spindle 6, interfering with progression of the drill spindle 6 through entry boards or the various layers of the PCB 14.

In some situations, heat generated by the drilling process affects the chemical property of some commonly available entry boards (for example, melting portions of the entry boards) such that the entry boards fail to effectively reduce to dust. In other situations, some entry sheets fail to degrade to dust unless the drill spindle 6 reaches undesirably high temperatures that may otherwise damage components of the circuit boards. Further, the size of waste substance that accumulates at the tip of the drill spindle 6 continues to increase in size as the drill spindle 6 further advances through the entry boards or layers of the PCB 14, thereby exacerbating the degree with which the bird nest (waste substance accumulating on or around the drill spindle 6) interferes with the drilling operation and/or accuracy. In some cases, the resistance created by the accumulating waste substance causes the drill spindle 6 to break, introducing undesirable debris to the system, necessitating more frequent and expensive drill spindle replacements, and also potentially substantially damaging the PCBs. The waste substance additionally can cause the drill spindle 6 to deflect out of its position, decreasing the accuracy with which the holes are created in the PCB 14 and/or damaging the PCB 14.

The improved entry sheet component 16 preferably comprises material, including adhesive material, that readily reduces to dust during the drilling process so as to minimize or avoid the problems associated with bird nesting, including, without limitation, drill deflection, drill spindle damage, etc. In some embodiments, the entry sheet component 16 comprises material, including polymer material, configured to reduce to dust as the drill spindle 16 advances through the entry sheet component 16. In another embodiment, the entry sheet component 16 reduces to dust upon contact with the drill spindle 6. The entry sheet component 16 that is reduced to dust can effectively be evacuated, for example, by a vacuuming mechanism associated with the drilling machine 4. In one embodiment, the entry sheet component 16 preferably comprises material, including polymer material, having thermal characteristics such that the entry sheet component 16 can withstand heat generated by the drilling process. In some embodiments, the entry sheet component 16 readily degrades to dust even under the heat of the drill without melting, oozing, or running, thereby minimizing or eliminating waste substance from forming around the drill spindle 6. In other embodiments, the entry sheet component 16 comprises polymer material, including epoxies, which reduces to dust under common drilling temperatures.

In the preferred embodiments, the entry sheet component 16 comprises adhesives or polymer material, including, without limitation, epoxies. In some embodiments, the entry sheet component 16 comprises adhesive material, including adhesives typically configured for different purposes than to facilitate drilling PCBs (attaching various layers of PCBs, entry sheets, backup boards, or the like). Adhesives are typically selected for bonding various internal and external layers of PCBs based on adhesive characteristics such as bond strength, dimensional stability, heat resistance, electrical properties, etc. Some of these qualities that make adhesives ideal for attaching laminates also make the adhesives perform well in a new application—as substantially distinct and separate layers for use as entry sheet layers in entry sheets. In one embodiment, the entry sheet component 16 comprises adhesive material configured to facilitate the drilling process, for example, by minimizing entry burrs, increasing accuracy, protecting the PCB 14 from damage, etc. The entry sheet 10, and the entry sheet component 16, can comprise adhesive material for purposes other than to bond layers of the entry sheet 10 together. In further configurations, the improved entry sheet component 16 comprises adhesives provided as coatings over substrates made from rigid material, such as the substrate layer 18 of FIG. 3A. Adhesives such as acrylics, polyimides, epoxies, modified polyesters, butyral phenolics, or the like are suitable for use as the entry sheet component 16. In other embodiments, the entry sheet component 16 comprises commercially available products (for example, DAUBERT'S DOUBOND products, product numbers 17092, 18973, 19102, 19109, 19112, 19116).

The entry sheet component 16 can also comprise resins selected from thermosetting or thermoplastic families of resins, for example, fabricated in sheet form. The entry sheet component 16 can comprise thermoplastic materials such as polyester, polyimide, polyetherimid, polycarbonate, cellulose triacetate, a combination of two or more of the above materials, or a combination of one or more of the above materials with other materials. In one embodiment, the entry sheet component 16 comprises thermoplastic polymer resins of the polyester family, including, without limitation, polyethylene terephthalate, which is sometimes referred to as MYLAR film, including SDI's smooth MYLAR film.

In some embodiments, the entry sheet component 16 comprises one or more thermosetting materials such as cured epoxy resins, phenolic resins, amine resins, polyvinylacetals, or the like, for example, formed into a thin layer. In the preferred embodiment, the entry sheet component 16 comprises epoxies. The epoxies can be of the type bisphenol a/epichlorohydrin. In one embodiment, preferred epoxies include, but are not limited to, two-part room temperature cured epoxies, polyimide cured epoxies, two-part bisphenol a epoxies, and diglycidyl ether of bisphenol a epoxies. Further still, epoxies can comprise an epoxy resin base and curing agents such as amines, polyamines, amides, polyamides, cycrloaliphatic agents, other appropriate agents, etc.

In accordance with one embodiment, the entry sheet component 16 comprises other curing and non-curing materials. In still other embodiments, the entry sheet component 16 comprises ether, including, for example, glyeidyl ether, alkyl glycidyl ether (for example, CAS# 68609-97-2), and the like. The entry sheet component 16 can also comprise other materials including, without limitation, carbonates such as calcium carbonate (for example, CAS# 1317-65-3), proprietary epoxies, titanium dioxide (for example, CAS# 13463-67-7), coloring agents such as yellow pigment (CAS# 51274-00-1), etc. In still other embodiments, the entry sheet component 16 comprises triethylenetetramine (for example, CAS# 112-24-3). Further still, the entry sheet component 16 can comprise phenols such as nonyl phenols (for example, CAS# 84852-15-3). Other non-limiting embodiments of the improved entry sheet component 16 that may be used and configured as described herein can be found, for example, on page 8, in the above-specified U.S. Provisional App. No. 60/976,264, which is incorporated by reference herein in its entirety.

The entry sheet 10, including the entry sheet component 16, in some particular embodiments is formed by combining epoxy resins, curing agents consisting essentially of polyamidoamine, and a third group of materials consisting essentially of calcium carbonate, triethylene tetramine, polyethylenepolyamine, titanuium dioxide, glycidyl ether, and nonyl phenol. The epoxy resin can be of the type bisphenol a/epichlorohydrin.

In some embodiments, the improved entry sheet component 16 comprises a two-component polymer material wherein a first solution is combined with a second solution to form the entry sheet component 16. The first solution can comprise epoxy resins, including adhesive epoxy resins, combined with a second solution such that the second solution cures the epoxy resins present in the first solution, thereby forming the entry sheet component 16. In one embodiment, the two-component polymer material comprises the first solution and the second solutions in equal volumes. In others, the first solution and the second solution having different volumes are combined to form the entry sheet component 16. In some embodiments, the second solution comprises curing agents configured to cure the epoxy resins present in the first solution. In others, the second solution comprises curing agents consisting essentially of aliphatic amines and polyamidoamines. In certain preferred embodiments, the first solution comprises epoxy resin (for example, CAS# 25068-38-6). In one embodiment, combining the first solution with the second solution partially cures the epoxy resin present in the first solution. In another, combing the first solution with the second solution fully cures the epoxy resin present in the first solution. The epoxy resin can comprises the bulk of the material of the first solution of the entry sheet component 16.

In other embodiments, the first solution comprises bisphenol a/epichlorohydrin epoxy resin, including at about 55-95% by weight, including about 85-95% by weight, about 80-90% by weight, about 55-85% by weight, about 55-75% by weight, about 55-65% by weight, about 65-85% by weight, about 65-95% by weight, about 65-75% by weight, about 75-90% by weight, etc. In one embodiment, the first solution comprises bisphenol a/epichlorohydrin epoxy resin at about 55-90% by weight, including about 60-70% by weight. In some embodiments, the first solution comprises another epoxy resin, including, for example, proprietary epoxy resins. In one embodiment, the first solution comprises the bisphenol a/epichlorohydrin epoxy resin at about 80-95% by weight, including about 80-90% by weight and/or about 85-95% by weight, and comprises the other epoxy resin at about 5-15% by weight.

In other embodiments, the first solution comprises one or more ethers, including glycidyl ethers at about 1-20%, including about 1-10% and about 1-5% by weight. Suitable glycidyl ethers include alkyl glycidyl ethers (for example, CAS# 68609-97-2 or C12-C14 alkyls). Additives may also be included in the first solution of the entry sheet component 16. In some embodiments, the first solution comprises additives such as colorants and some salts at a relatively low portion by weight, for example, on the order of about 1-2% or about 1-5%. In yet other embodiments, however, the amount of salt, such as calcium carbonate, present in the first solution can be as much as about 25-45% by weight, including about 25-40% by weight, about 25-35% by weight, about 30-40% by weight, etc. In one arrangement, the first solution comprises titanium dioxide less than 2% by weight and/or yellow pigment less than 2% by weight. Other non-limiting embodiments of the improved entry sheet component 16 that may be used and configured as described herein can be found, for example, on page 8, in the above-specified U.S. Provisional App. No. 60/976,264, which is incorporated by reference herein in its entirety.

In accordance with one embodiment, the entry sheet component 16 is formed by combining the first solution comprising epoxy resins with the second solution, for example, to cure the epoxy resins present in first solution, thereby forming the entry sheet component 16. In some embodiments, the first solution is combined with the second solution, the second solution comprising curing agents to sufficiently cure the resin, including epoxy resin, present in the first solution. The entry sheet component 16 can be formed from the second solution, the second solution comprising curing agents such as amines, polyamines, amides, polyamides, cycrloaliphatic agents, other appropriate polymerizing agents, or the like. In some embodiments, the second solution comprises materials such as, without limitation, polethylenepolyamine, polyamidoamine, triethylenetetramine, or the like.

In some embodiments, the second solution comprises curing material wherein amine forms the bulk of the material. In one embodiment, the second solution comprises amine, such as, for example, polyamidoamine, at about 50-88% by weight, including about 50-70% by weight, about 50-75% by weight, about 84-88% by weight, about 55-75% by weight, about 55-65% by weight, about 55-60% by weight, about 65-85% by weight, about 75-85% by weight, etc. In another embodiment, the second solution comprises amine greater than 80% by weight. In other embodiments, the second solution can comprise about 50-70% by weight polyamidoamine, including about 50-60% by weight and about 60-70% by weight. In another configuration, the second solution comprises less than about 10% by weight of polyethylenepolyamine.

Further still, the second solution can comprise amine typically provided in adhesive materials at about 84-88% by weight. In some embodiments, the second solution comprises one or more carbonates, including calcium carbonates, at about 25-45%, including about 25-35% and about 35-45% by weight. Other materials can be included in the second solution such as, without limitation, nonyl phenol and/or triethylenetetramine. In one embodiment, the second solution comprises nonyl phenol and/or triethylenetetramine of low concentrations, for example, on the order of about 1-16% by weight. In yet other embodiments, the second solution comprises less than 10% by weight of triethylenetetramine and about 12-16% by weight of nonyl phenol.

D. EXAMPLES 1-7

Test Drill Runs

Various embodiments of the improved entry sheet component 16 and other commonly used and comparable entry sheets were provided over different configurations of PCBs in varying test environments and the entry sheets and the PCBs were drilled in succession in realistic settings so as to determine the performance of the various entry sheets. The test drill parameters and performance measurements are described in Examples 1-7 below. In Examples 1-6, the improved entry sheet 10 comprising the entry sheet component 16 and the substrate layer 18 as described in this application was used. The entry sheet component 16 comprised epoxy adhesive formed from polymer material comprising bisphenol a/epichlorohydrin epoxy resin. The substrate layer 18 comprised aluminum. In Example 7, the improved entry sheet component 10 comprising the entry sheet component 16 formed from MYLAR film or a MYLAR coating material was used.

Performance Evaluation Methods

Four different ways of measuring performances of the various entry sheets, including quantifying hole registration accuracy and tolerance levels associated with drilling printed circuit boards, employed in Examples 1-7 include Process Capability Index ($C_{pK}$), True Position Diameter (TPD), True Position Radius (TPR), and Linear measurements.

$C_{pK}$, a six-sigma compatible statistical tool, measures process capability, the ability of a process to produce outputs within specification limits or tolerance levels. $C_{pK}$ predicts performances of systems or processes based upon collected test data and indicates process capability taking into account the effect of non-centered data distribution. $C_{pK}$ of a process can be calculated using:

$$(i) C_{pk} = \min\left[\frac{USL - \hat{\mu}}{3 \times \hat{\sigma}}, \frac{\hat{\mu} - LSL}{3 \times \hat{\sigma}}\right]$$

where USL and LSL define upper and lower tolerance levels, $\hat{\mu}$ is the estimated mean of the process, and $\hat{\sigma}$ is the estimated variability of the process. Process capability is a validation technique often employed to qualify a particular PCB drilling process or PCB drill machine system. $C_{pK}$ measures how close a drilling machine is running to its specification levels relative to the variability of the process and, therefore, the larger the $C_{pK}$, the less likely the drilling machine drills outside of the tolerance level. Typically, $C_{pK}$ of 1.33 or higher is preferred in manufacturing processes, including drilling printed circuit boards.

One of the objects of Examples 1-7 is to show that drilling printed circuit boards using the improved entry sheet component 16 improves the drilling process by enabling drilling machines to operate closer to their operational capabilities than other entry sheets. In both Example 1 and other examples, careful consideration was exercised to maintain a consistent drilling environment so as to ensure that the contribution to process capability made by the tested entry sheets was satisfactorily attributable to the entry sheets and not to other factors such as drilling machine control, configuration of cutting tool, gripping arrangement, precision of drilling spindle, etc. A $C_{pK}$ analysis of acceptance trials often entails scatter plots indicating the degree of scatter around a nominal target point, the nominal target point being the position of the ideal accurate hole. The improved entry sheet 10 is configured to provide $C_{pK}$ values in the range of about 0.91-2.93, including 1.0-2.8, 1.0-2.7, 1.8-2.6, 1.5-2.5, 1.7-2.3, etc.

TPD describes the actual diameter of the area that is occupied by the data. FIG. 4B shows the circles 79 illustrating TPD values of various diameters on a scatter graph. TPR is related to TPD and describes the actual radius of the area that is occupied by the data and is ½ TPD. In Example 1-7, TPR is calculated, as shown in FIG. 4C, by determining the distance between a center 83 of a drilled hole 82 and a center 84 of a nominal hole 81, the nominal hole 81 being the position of the ideal accurate hole. In Examples 1-7, TPR is provided in inches. A lower TPR is desired in drill systems because the lower the TPR for a drilled hole, the closer the center 83 of the drilled hole 82 is to the center 84 of the nominal hole 81, indicating a more accurate positioning of the drilled hole 82. The improved entry sheet 10 is configured to provide TPR values, in inches, the range of about 0.00106 to 0.00690, including 0.00110-0.00680, 0.00120-0.00600, 0.00125-

0.00500, etc. The distance 85 between the center 84 of the nominal hole 81 and the center 83 of the drilled hole 82 can be calculated by calibrating the center 84 of the nominal hole 81 as the point 0,0 on the rectangular coordinate system (X & Y axis), determining the x,y position of the center 83 of the drilled hole 82, and calculating the distance 85 between the two centers using:

$$TPR = \sqrt{(x^2 + y^2)} \quad \text{(ii)}$$

Linear measurements describe the amount of error in the X & Y axis, the graphical representation of which is illustrated as a rectangle 78 in FIG. 4B. A smaller linear measurement indicates a more accurately positioned drilled hole. Analyzing accuracy measurements in a linear fashion is more limited than other radial measurements because the drill data of holes results in a circular pattern. Nevertheless, linear measurement data for Example 4 is provided. Further non-limiting discussions of accuracy measurements related to the improved entry sheet component 16 that may be used and configured as described herein can be found, for example, on page 5-6 and in Appendix A and B, in the above-specified U.S. Provisional App. No. 60/976,264, which is incorporated by reference herein in its entirety.

Example 1

Figure 4A:
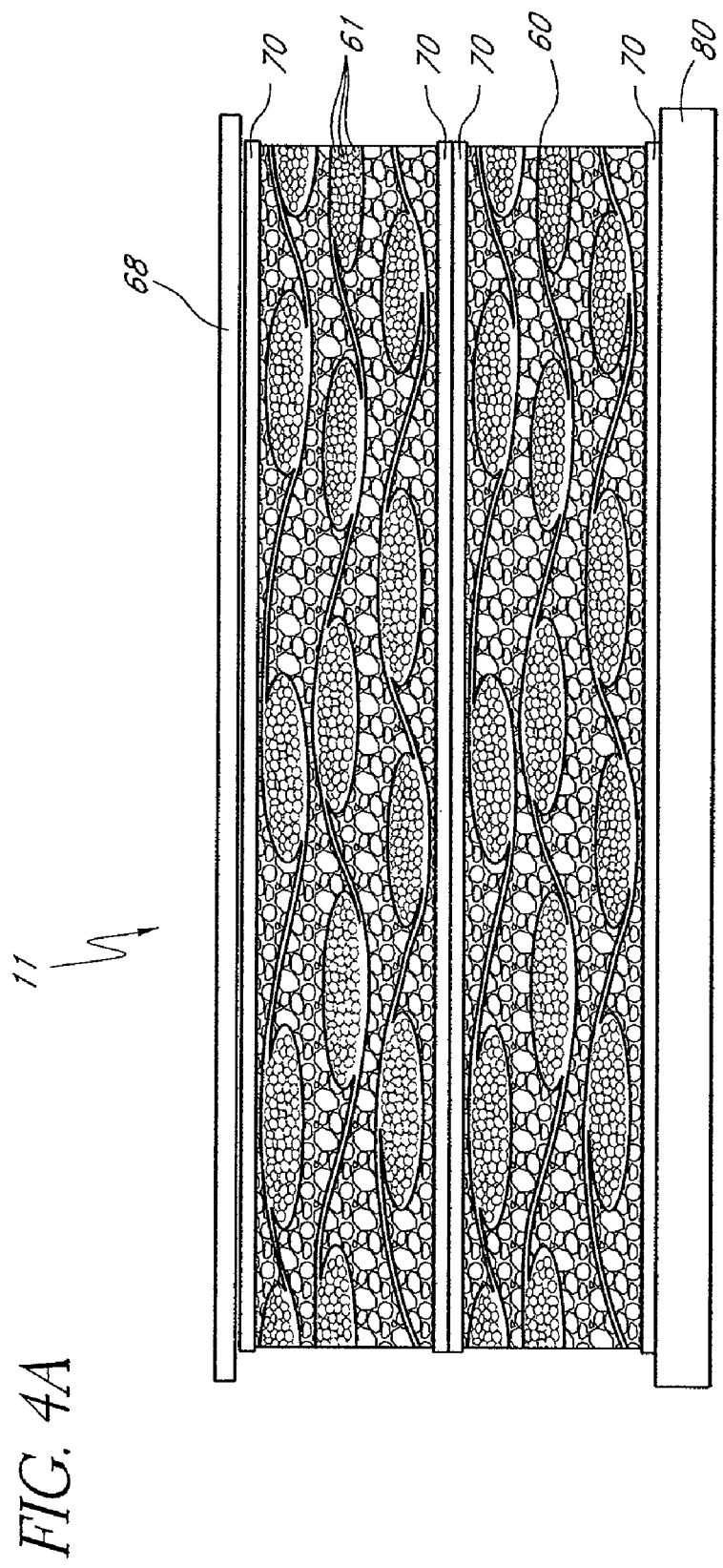
FIG. 4A illustrates an entry sheet provided over a stack of printed circuit boards.
Figure 4B:
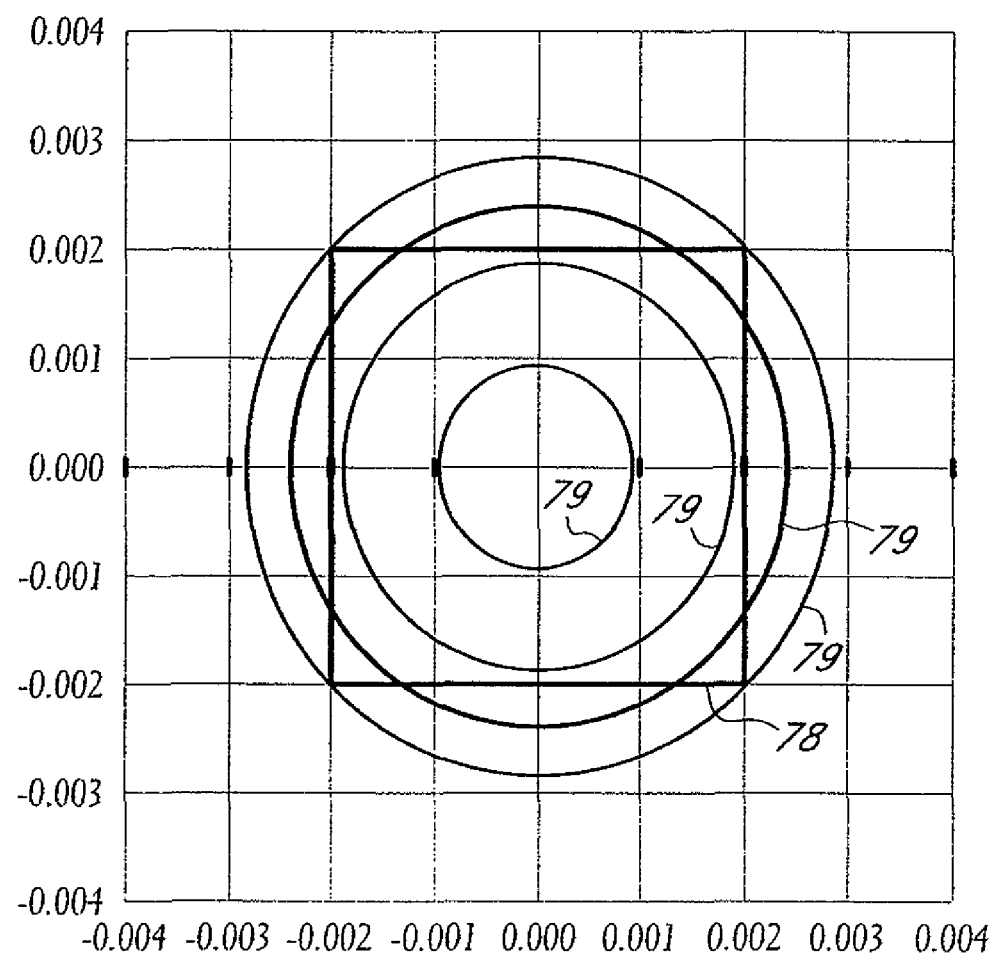
FIG. 4B illustrates graphical representations of True Position Diameter (TPD) and Linear Measurement accuracy measurements provided in a scatter graph.
Figure 4C:
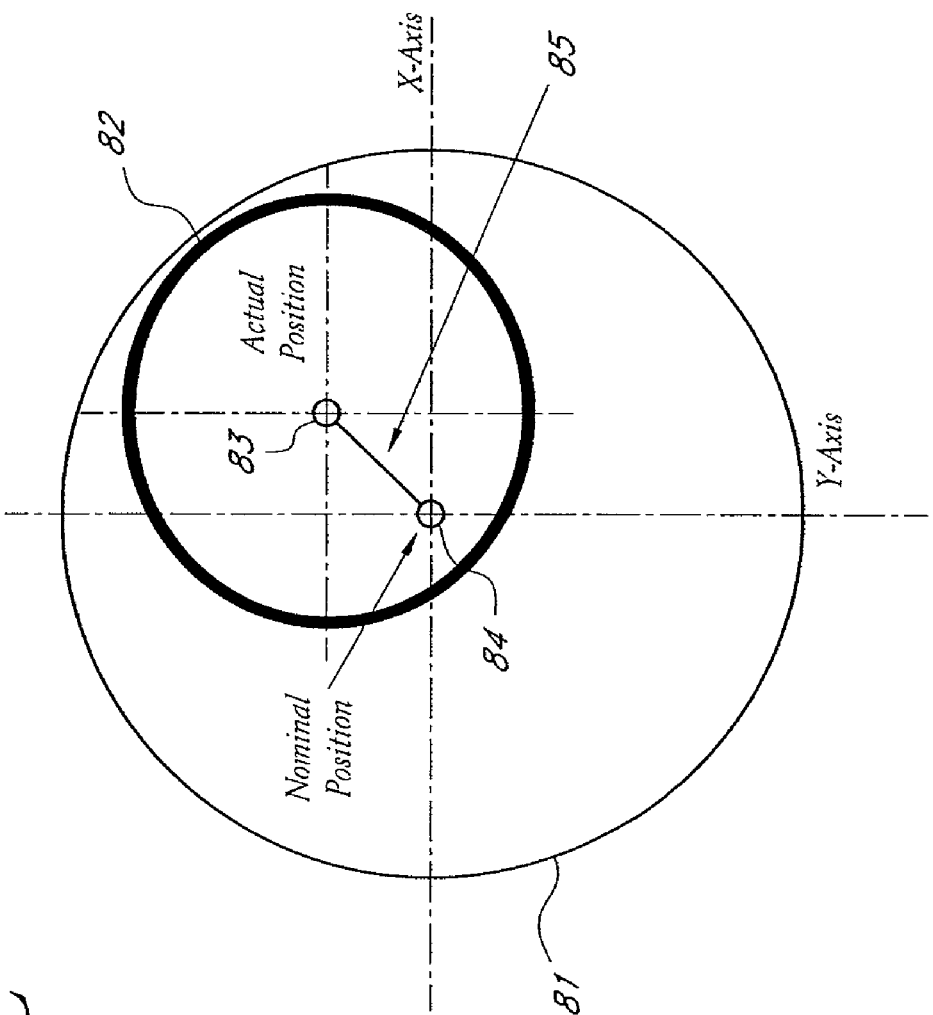
FIG. 4C illustrates one method of calculating True Position Radius (TPR).

FIG. 4A shows a panel 11 on which drilling was carried out in Example 1 to determine the influence of the improved entry sheet component 16 on drill accuracy and to compare the performance of the improved entry sheet component 16 with other entry sheets. The panel 11 comprises an entry sheet 68, and a stack of PCBs having first and second dielectric layers 60, 61, each dielectric layer 60, 61 being a double-sided laminate having conductive layers 70 on each surface, the conductive layers 70 having 1 ounce copper material, and a backup board 80. Four different entry sheets were provided as the entry sheet 68 to drill the panel 11, as described further herein.

The first and second dielectric layers 60, 61, the conductive layers 70, the backup board 80 were selected so as to provide a realistic representation of drilling in production. Accordingly, overlaying the entry sheet 68 over the stack of PCBs and drilling the entry sheet 68 and the stack of PCBs in succession provided information on how each of the entry sheets 69 perform when used in real-life applications. Each of the first and second dielectric layers 60, 61 comprised 0.059 inch thick, double-sided ISOLA brand FR-4 laminate. In FIG. 4A, a 0.093 inch LCOA TEK BOARD material was used as the backup board 80.

Still with reference to FIG. 4A, the panel 11 was drilled using four different types of entry sheets as the entry sheet 68: (1) 0.012 inch LCOA EO+, an entry sheet manufactured and sold by Laminated Company of America (LCOA) having aluminum laminated to both sides of a cellulose core; (2) 0.007 inch solid aluminum entry board (3303 Alloy H19 hardness); (3) 0.014 inch lubricated entry (LE) sheet, an entry sheet manufactured and sold by Mitsubishi Gas Chemical Company, Inc. having a lubricating layer and an aluminum sheet; and (4) 0.009 inch entry sheet component 16 comprising the entry sheet component 16 and the substrate layer 18. The improved entry sheet component 16 in Example 1 comprised a 0.006 inch entry sheet component 16 provided over a 0.003 inch substrate layer 18. Each one of the four entry sheets was drilled using the same EXCELLON CONCEPT I single-spindle machine so as to minimize variation. The drill parameters of the EXCELLON CONCEPT I drill machine as used in Example 1 were as follows: 0.0135 inch drill diameter; 0.220 inch drill flute length; 110,000 rpm drill speed; 88 ipm feed; 800 ipm retract; and 2020 max hits.

The performances of each of the four entry sheets in Example 1 were measured in consistent test environments to minimize undesired accuracy measurement variances arising from differences in test parameters such as lighting methods, camera resolution, quality of the optics, magnification, algorithms used to identify the actual edge of drilled holes, etc. Accuracy measurements for each of the four entry sheets were obtained on an EXCELLON CONCEPT I drill machine with an ITRAN Vision System. Two 0.0453" diameter holes were used to align the vision system to the drilled pattern formed on the panels 11. Four of the panels 11 each including one of the four entry sheets were sent through a high-pressure air spray to remove any debris remaining in the holes so as to increase the reliability of the results obtained from a vision system. The panels 11 were allowed to stabilize with the Vision System for 48-hours prior to analyzing the drill data. In Example 1, the actual location of the drilled hole position was determined from measuring the location of the drilled hole at the top of the panel 11. In order to take measurements of the drilled holes, the EXCELLON CONCEPT I projected light atop the panel 11 and, using an algorithm, identified 96 points around the circumference of the hole to determine the best fit for a circle.

Figure 5B:
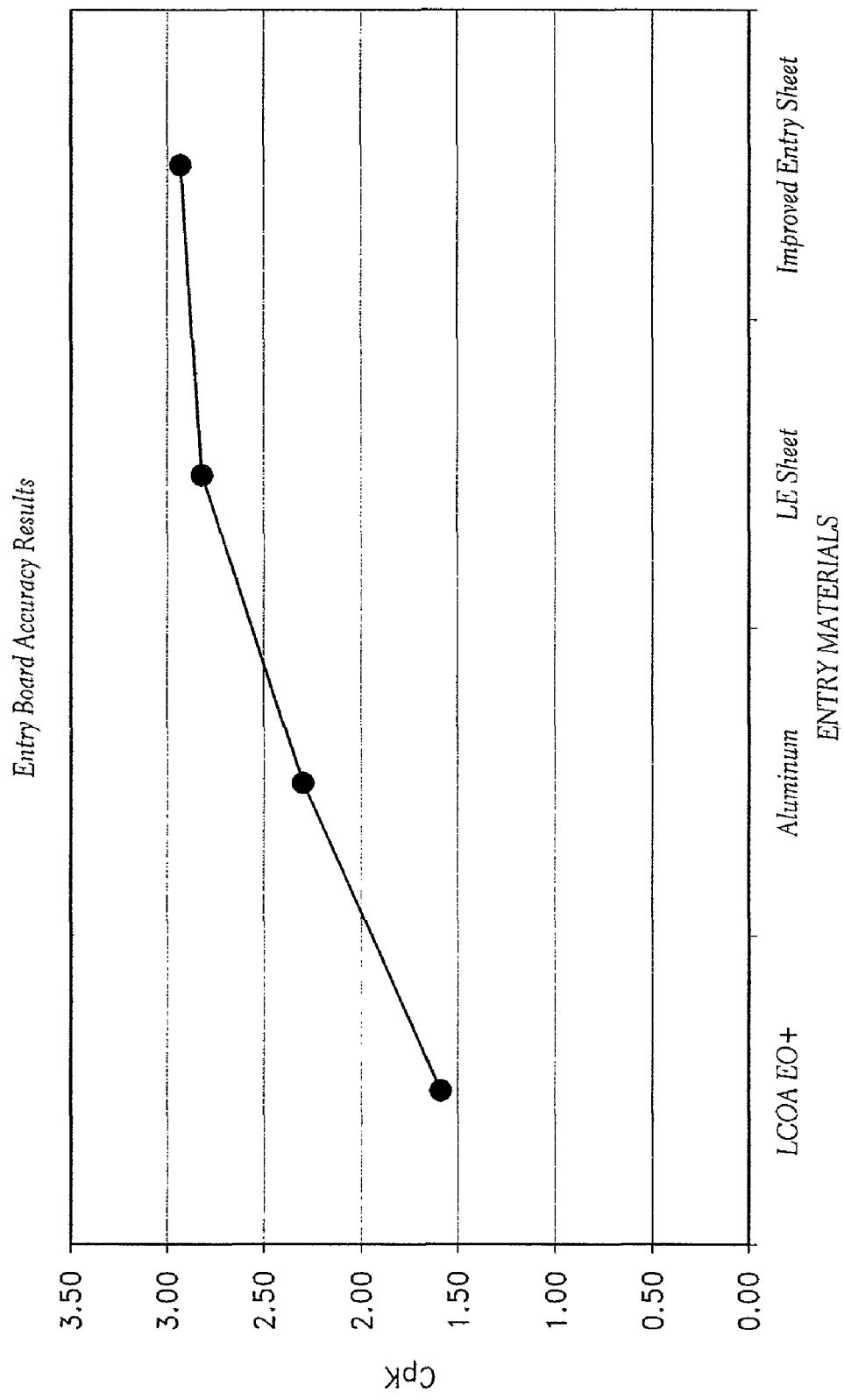
FIG. 5B is a graph comparatively illustrating the accuracy measurements of FIG. 5A.

FIG. 5A illustrates the panel 11 configuration, drill machine parameters, and accuracy measurements for the drill tests in Example 1. FIG. 5A illustrates $C_{pK}$ and TPR (in inches) values for a +/−0.0015 inch tolerance level, which is equivalent to about a 0.00212 inch TPR. As shown in FIG. 5A and the associated chart in FIG. 5B, the position of the holes formed on the panel 11 drilled with the improved entry sheet component 16 were the most accurate at 2.93 $C_{pK}$ in comparison with $C_{pK}$ values of 1.59, 2.3, and 2.8 for the LOCA EO+, aluminum, and LE sheet entry sheets.

Example 2

In Example 2, the improved entry sheet component 16 and an LE sheet entry sheet were provided over a PCB panel, and the entry sheets and the PCB panels were drilled in succession. The rows associated with Example 2 in FIG. 6 show the configuration of the PCBs, drill parameters of the drill machine, and the accuracy measurements resulting from the test drill run of Example 2. Drilling in Example 2 was conducted to compare the performance, including accuracy measurements, of the 0.009 inch thick entry sheet component 16 with a 0.014 inch thick LE sheet entry sheet. The improved entry sheet component 16 in Example 2 comprised a 0.006 inch entry sheet component 16 provided over a 0.003 inch substrate layer 18, the substrate layer 18 comprising aluminum. The entry sheets were provided over a 0.1100 inch thick stack of 1-high 26-layer PCB having FR-406 dielectric layers and ½ ounce outer copper conductive layer and 2 ounce internal copper layers.

Each of the improved entry sheet component 16 and the LE sheet entry sheet were provided over PCB stacks supported by exit boards. The improved entry sheet component 16 was tested in combination with a SLICKBACK backup board (0.095 inch thick) and the LE sheet entry sheet was tested in combination with a 0.096 inch thick STARboard back up board. An EXCELLON CENTURY 2001 drilling machine was used to drill the PCB stacks in Example 2, the drilling machine having the following parameters: 0.0098 inch drill diameter; 0.185 inch drill flute length; 125,000 rpm drill speed; 114 ipm feed; 600 ipm retract; and 2200 max hits. Accuracy measurements in Example 2 were taken from the bottom of the PCB stack for linear tolerances of +/−0.002 inches. As can be seen in the rows of data associated with Example 2 in FIG. 6, the LE sheet entry sheet resulted in a $C_{pK}$ of 0.56 and a TPR of 0.00355 whereas the improved entry sheet component 16 attained increased accuracy at a $C_{pK}$ of 0.91 and TPR of 0.00276.

Example 3

Still with reference to FIG. 6, a set of accuracy measurements were taken to compare the performance of the improved entry sheet component 16 and an LE sheet entry sheet using a different PCB stack configuration. As in Example 2, the improved entry sheet component 16 in Example 3 comprised a 0.006 inch entry sheet component 16 provided over a 0.003 inch substrate layer 18, the substrate layer 18 comprising aluminum. In Example 3, the entry sheets were provided over a 0.098 inch thick, 1-high, 18-layer PCB having FR-406 dielectric layers, ½ ounce outer and 1 ounce internal copper conductive layers.

Each of the improved entry sheet component 16 and the LE sheet entry sheet were provided over PCB stacks supported by exit boards, the improved entry sheet component 16 being tested in combination with a SLICKBACK backup board (0.096 inch thick) and the LE sheet entry sheet being tested in combination with a STARboard backup board (0.095 inch thick). An EXCELLON CENTURY 2001 drilling machine was used to drill the PCB having the following drilling parameters: 0.0079 inch drill diameter; 0.118 inch drill flute; 125,000 rpm drill speed; 55 ipm feed; 700 ipm retract; and 1500 max hits. As can be seen the rows associated with Example 3 in FIG. 6, the LE sheet entry sheet resulted in a $C_{pK}$ of 0.53 and a TPR of 0.00310. The improved entry sheet component 16 attained better accuracy measurements of a 0.92 $C_{pK}$ and a TPR of 0.00226. Example 3 illustrates $C_{pK}$ and TPR values for +/− 0.002 inch tolerance levels.

| Improved entry sheet component | | | | |
|---|---|---|---|---|
| CPK | | Standard Deviation | True Position | |
| Linear: | 0.90 | X: 0.000685 | Radius: | 0.00226 |
| Radial: | 0.92 | Y: 0.000741 | Diameter: | 0.00452 |
| | | Radial: 0.000442 | Diameter Tolerance: | 0.005445 |

| LE Sheet | | | | |
|---|---|---|---|---|
| CPK | | Standard Deviation | True Position | |
| Linear: | 0.74 | X: 0.00085 | Radius: | 0.0031 |
| Radial: | 0.53 | Y: 0.000901 | Diameter: | 0.0062 |
| | | Radial: 0.000572 | Diameter Tolerance: | 0.007319 |

Example 4

As shown in FIG. 6, Example 4 illustrates the performances of the improved entry sheet component 16 in comparison with a 0.007 inch thick aluminum entry board. The improved entry sheet component 16 in Example 4 comprised a 0.006 inch entry sheet component 16 provided over a 0.003 inch substrate layer 18, the substrate layer 18 comprising aluminum. The entry sheets were provided over a 0.098 inch thick stack of a 1-high 18-layer PCB having FR-406 dielectric layers, ½ ounce outer and 1 ounce internal copper conductive layers.

Each of the improved entry sheet component 16 and the LE sheet entry sheet were provided over PCB stacks supported by exit boards. The improved entry sheet component 16 was tested in combination with a SLICKBACK backup board (096 inch thick) and the LCOA EO+ board was tested in combination with a 0.095 inch STARboard back up board. An EXCELLON CENTURY 2001 drilling machine was used to drill the PCB having the following drilling parameters: 0.0079 inch drill diameter; 0.118 inch drill flute; 125,000 rpm drill speed; 55 ipm feed; 700 ipm retract; and 1500 max hits. As shown in the rows associated with Example 4 in FIG. 6, the improved entry sheet component 16 attained increased accuracy at a $C_{pK}$ of 1.76 and a TPR of 0.00160 in comparison with the LE sheet entry sheet ($C_{pK}$ of 1.36 and TPR of 0.00291).

Example 5

In Example 5, the improved entry sheet component 16 and a 0.007 inch aluminum entry board were provided over a 0.062 inch thick stack of a 1-high, 2-layer PCB having FR-408 dielectric layers and 1 ounce outer copper layers. Each of the PCBs in Example 5 were supported by SPECTRUM GOLD exit boards. A HITCAHI UNION TOOL drilling machine was used to drill each of the PCBs in Example 5, the drilling machine having the following drilling parameters: 0.0079 inch drill diameter; 0.118 inch drill flute; 120,000 rpm drill speed; 79 ipm feed; 500 ipm retract; and 2000 max hits. As shown in FIG. 6, the improved entry sheet component 16 resulted in a $C_{pK}$ of 1.66 and a TPR of 0.00150. In comparison, the aluminum entry board obtained less accurate measurements of a $C_{pK}$ of 1.11 and a TPR of 0.00244.

Example 6

In Example 6, the improved entry sheet component 16 and a 0.007 inch aluminum entry board were provided over a 0.093 inch thick stack of 1-high, 2-layer PCBs having FR-4 dielectric layers and 1 ounce outer copper layers. Each of the PCBs in Example 6 were supported by SLICKBACK exit boards (0.096 inch thick). A Hitcahi drilling machine was used to drill each of the PCBs in Example 6, the drilling machine having the following drilling parameters: 0.0098 inch drill diameter; 0.187 inch drill flute; 125,000 rpm drill speed; 87 ipm feed; 700 ipm retract; and 2020 max hits.

Figure 7B:
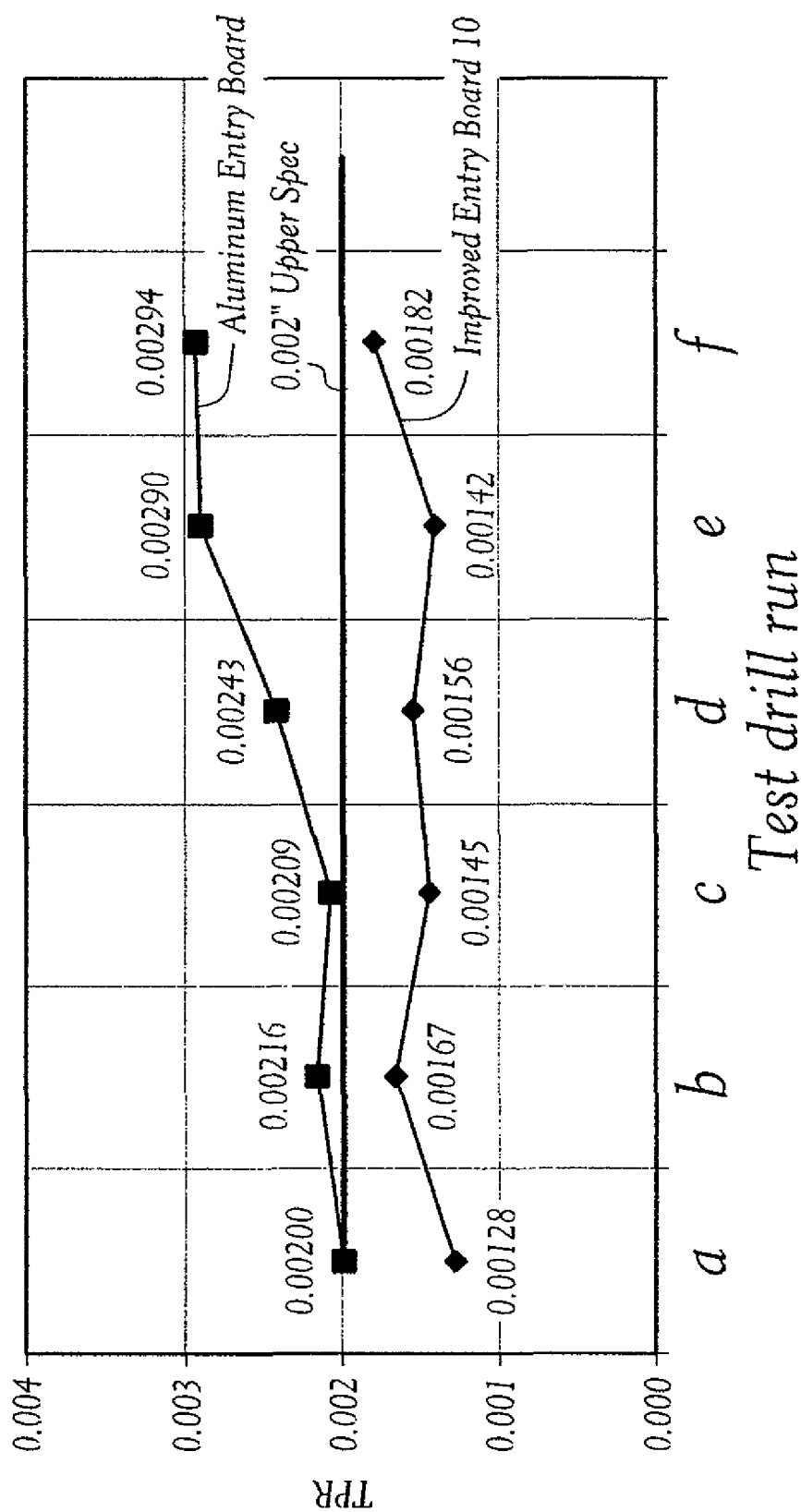
FIG. 7B is a graph comparatively illustrating the accuracy performances of the entry sheet and the aluminum entry board.

Each of the improved entry sheet component 16 the aluminum entry board were overlaid on the PCBs and the entry sheets and the PCBs were drilled in succession. Six entry sheets 10 and 6 aluminum entry boards were each provided over different PCBs, and the entry sheets and PCBs were drilled in succession to assess the performance of the entry sheets given a +/−0.002 inch upper specification TPR tolerance level. As shown in FIG. 7A, the $C_{pK}$ values for each of the 6 drill runs in Example 6 were higher for the improved entry sheet component 16 ($C_{pK}$ of 2.61, 1.47, 1.94, 1.56, 1.83, and 1.03 for drill runs a, b, c, d, e, and f) when compared with the aluminum entry board ($C_{pK}$ of 1.00, 0.75, 1.18, 0.67, 0.67, and 0.52 for drill runs a, b, c, d, e, and f). Further, as illustrated in the table of FIG. 7A and the corresponding chart in FIG. 7B, the improved entry sheet component 16 performed well under the +/−0.002 inch upper specification tolerance level for each of the drill runs with TPR values, in inches, of 0.00128, 0.00167, 0.00145, 0.00156, 0.00142, and 0.00182 for drill runs a, b, c, d, e, and f. As shown in FIG. 7A, the aluminum entry board fared relatively worse and exceeded the +/−0.002 inch upper specification level on all but the first drill run, resulting in TPR values of 0.002, 0.00216, 0.00209, 0.00243, 0.00290, and 0.00294 for drill runs a, b, c, d, e, and f.

Example 7

In Example 7, the improved entry sheet component 16 of FIG. 3B comprising the entry sheet component 16 was provided over a panel having two layers of 0.059 inch thick double-sided boards, the boards having FR-4 aminates and 0.51 ounce outer copper layers. In Example 7, the improved entry sheet component 16 comprised the 4 mil thick entry sheet component 16 having thermoplastic polymer resins of the polyester family such as polyethylene terephthalate, and more particularly, material comprising MYLAR. The panel was drilled using a 60300135 drill TULON having the following parameters: 0.0135 inch drill diameter; 0.118 inch drill flute; 110,000 rpm drill speed; 88 ipm feed; 800 ipm retract; and 2000 max hits. The improved entry sheet component 16 comprising the entry sheet component 16 resulted in a $C_{pK}$ of 3.54 and a TPR of 0.00063.

The improved entry sheet 10 as described in various embodiments herein provides significant improvements, including, without limitation, in location accuracy and damage resistance compared to other commonly available entry boards. After evaluating all of the available data from the above testing, it is further possible also to conclude that the improved entry sheet component 16 provides benefits that can contribute to, among others, reducing the height of entry burrs. The coated entry material can enhance the process window and allow better overall results that may contribute to reduced scrap levels and reduced costs for PCB fabrication.

The various embodiments described herein can also be combined to provide further embodiments. Related methods, apparatuses and systems utilizing the improved entry sheet component 16 are described in the above-referenced provisional application to which this application claims priority, the entireties of each of which are hereby expressly incorporated by reference: U.S. Provisional Patent Application Ser. No. 60/976,264, filed Sep. 28, 2007, and titled "COATED ENTRY SHEET." While the above-listed application may have been incorporated by reference for particular subject matter as described earlier in this application, Applicants intend the entire disclosures of the above-identified application to be incorporated by reference into the present application, in that any and all of the disclosures in these incorporated by reference applications may be combined and incorporated with the embodiments described in the present application.

Although the foregoing description has shown, described and pointed out the fundamental novel features of the embodiments disclosed herein, it will be understood that various omissions, substitutions, and changes in the form of the detail of the apparatus as illustrated, as well as the uses thereof, may be made by those skilled in the art, without departing from the spirit or scope of the present invention. Consequently, the scope of the present application should not be limited to the foregoing discussion, but should be defined by the appended claims.

What is claimed is:

1. An entry sheet for drilling circuit boards with a drilling tool, the drilling tool entering the entry sheet from the top of the entry sheet in a predetermined drilling area, the entry sheet comprising:
a planar, sheeted substrate layer having a thickness of about 6 mils or less and configured to be positioned over at least one printed circuit board which is to be drilled, the substrate layer having a bottom surface and a top surface, the bottom surface having no adhesive properties and adjacent the top surface of the at least one printed circuit board to be drilled; and
an entry sheet component provided over the top surface of the substrate layer, wherein the entry sheet component has a thickness of about 6 mils or less;
wherein the substrate layer comprises at least one layer of aluminum;
wherein the entry sheet component comprises, in a single layer, a coating coated on the top surface of the substrate layer, such that the drilling tool first passes through the coating during drilling of the circuit board, the entry sheet component comprising a fully cured, completely hardened, fully thermoset epoxy resin adhesive composition, the composition comprising:
bisphenol a/epichlorohydrin-based epoxy with no thermoplastic resins,
a curing agent, and
a salt, comprising between about 25% and about 45% by weight of the entry sheet component, based on the total weight of the entry sheet component, whereby the entry sheet component is configured to degrade to dust upon drilling;
wherein the entry sheet component is in a fully cured, completely hardened state when the substrate layer is positioned over the at least one printed circuit board.

2. The entry sheet of claim 1, wherein the entry sheet has a thickness in the range of about 4-12 mils.

3. The entry sheet of claim 1, wherein the substrate layer has a thickness in the range of about 1-6 mils.

4. The entry sheet of claim 1, wherein the entry sheet component has a thickness in the range of about 2-6 mils.

5. The entry sheet of claim 1, wherein the substrate layer comprises high-density fiberboard, medium density fiberboard, metal, metal alloys, paper, melamine, random fiber mats, plastic, chip board, particle board, phenolic, phenolic supported with paper, cloth, or glass fiber, solid phenolic sheets, or laminated phenolic sheets.

6. The entry sheet of claim 1, wherein the entry sheet component further comprises triethylenetetramine.

7. The entry sheet of claim 1, wherein the salt comprises calcium carbonate.

8. An entry sheet for drilling circuit boards, the entry sheet comprising:
A planar, sheeted substrate layer configured to be positioned over at least one printed circuit board which is to be drilled, the substrate layer having a bottom surface and a top surface, the bottom surface having no adhesive properties and adjacent the top surface of the at least one printed circuit board to be drilled;
an entry sheet component coated on the top surface of the substrate layer and comprising, in a single layer, a coating thereon, the coating being exposed to the drilling tool such that the drilling tool first passes through the coating during drilling of the circuit board, wherein the entry sheet component comprises a fully cured, completely hardened thermoset adhesive containing no thermoplastics, the adhesive selected from the group consisting of an epoxy, an acrylic, a polyimide, a butyral phenolic, or a combination of two or more of the above; and
a salt, comprising between about 25% and about 45% by weight of the entry sheet component, based on the total weight of the entry sheet component, whereby the entry sheet component is configured to degrade to dust upon drilling;

wherein the entry sheet component is in a fully cured, completely hardened state when the substrate layer is positioned over the at least one printed circuit board.

9. The entry sheet of claim 8, wherein the entry sheet has a thickness in the range of about 3-6 mils.

10. The entry sheet of claim 8, wherein the substrate layer has a thickness of about 6 mils or less.

11. The entry sheet of claim 10, wherein the substrate layer comprises high-density fiberboard, medium density fiberboard, metal, metal alloys, paper, melamine, random fiber mats, plastic, chip board, particle board, phenolic, phenolic supported with paper, cloth, or glass fiber, solid phenolic sheets, or laminated phenolic sheets.

12. The entry sheet of claim 10, wherein the epoxy is of the type bisphenol a/epichlorohydrin.

13. The entry sheet of claim 8, wherein the entry sheet component degrades to dust when drilled by drills having a diameter of 6.7 mm or less.

14. The entry sheet of claim 8, wherein the entry sheet component is sufficiently resistant, whereby the printed circuit board is protected from mechanical damage during drilling.

15. The entry sheet of claim 8, wherein the entry sheet component is configured to create a bushing during drilling capable of restraining the drill during drilling, in order to restrain lateral deflection of drill spindles used to drill holes in the circuit boards.

16. The entry sheet of claim 8, wherein the salt comprises calcium carbonate.

* * * * *